United States Patent [19]
Gomi et al.

[11] Patent Number: 5,163,178
[45] Date of Patent: Nov. 10, 1992

[54] SEMICONDUCTOR DEVICE HAVING ENHANCED IMPURITY CONCENTRATION PROFILE

[75] Inventors: Takayuki Gomi, Tokyo; Minoru Nakamura, Kanagawa; Hiroaki Anmo, Kanagawa; Norikazu Chuchi, Kanagawa; Hiroyuki Miwa, Kanagawa; Akio Kayanuma, Kanagawa; Koji Kobayashi, Kanagawa, all of Japan

[73] Assignee: Sony Corporation, Tokyo, Japan

[21] Appl. No.: 634,454

[22] Filed: Dec. 27, 1990

[30] Foreign Application Priority Data

Dec. 28, 1989 [JP] Japan ................................ 1-344269

[51] Int. Cl.$^5$ ............................................. H01L 29/72
[52] U.S. Cl. ........................... 257/558; 257/554; 257/556
[58] Field of Search .................. 357/35, 88, 89, 90, 357/91

[56] References Cited

U.S. PATENT DOCUMENTS 4,005,452 1/1977 Martinelli et al. ................. 357/35

FOREIGN PATENT DOCUMENTS 56-62361 5/1981 Japan ................................ 357/35

OTHER PUBLICATIONS

A. S. Grove, *Physics and Technology of Semconductor Devices*, John Wiley & Sons, New York (1967) pp. 78-83.

*Primary Examiner*—J. Carroll
*Attorney, Agent, or Firm*—Hill, Van Santen, Steadman & Simpson

[57] ABSTRACT

A semiconductor device comprises a semiconductor substrate provided with a collector region a base region and an emitter region in a lateral arrangement. Respective portions having peak impurity concentrations of the collector region and the emitter region are formed within the semiconductor substrate. A method of fabricating a semiconductor device comprises a step of forming a collector region of a second conduction type and an emitter region of a second conduction type in a lateral arrangement in a semiconductor substrate serving as a base region of a first conduction type by using a first mask provided with a pair of openings, and a step of forming heavily doped regions of the second conduction type so as to be connected respectively to the collector region and the emitter region by using a second mask provided with a pair of openings separated from each other by a distance greater than the distance between the openings of the first mask.

1 Claim, 21 Drawing Sheets

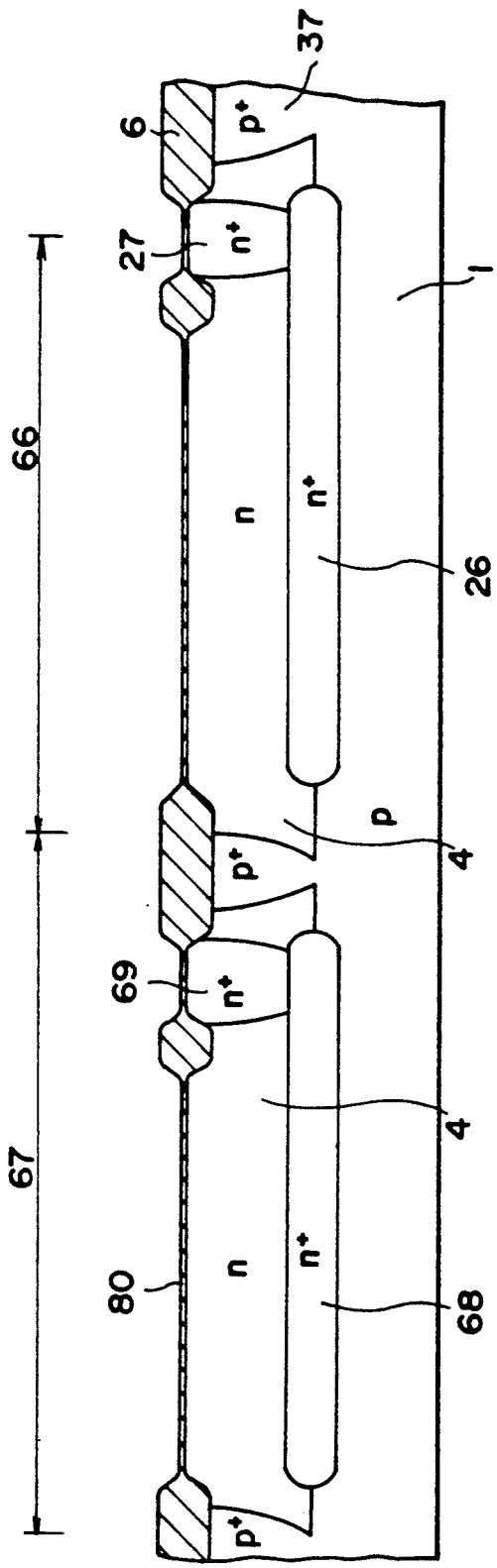
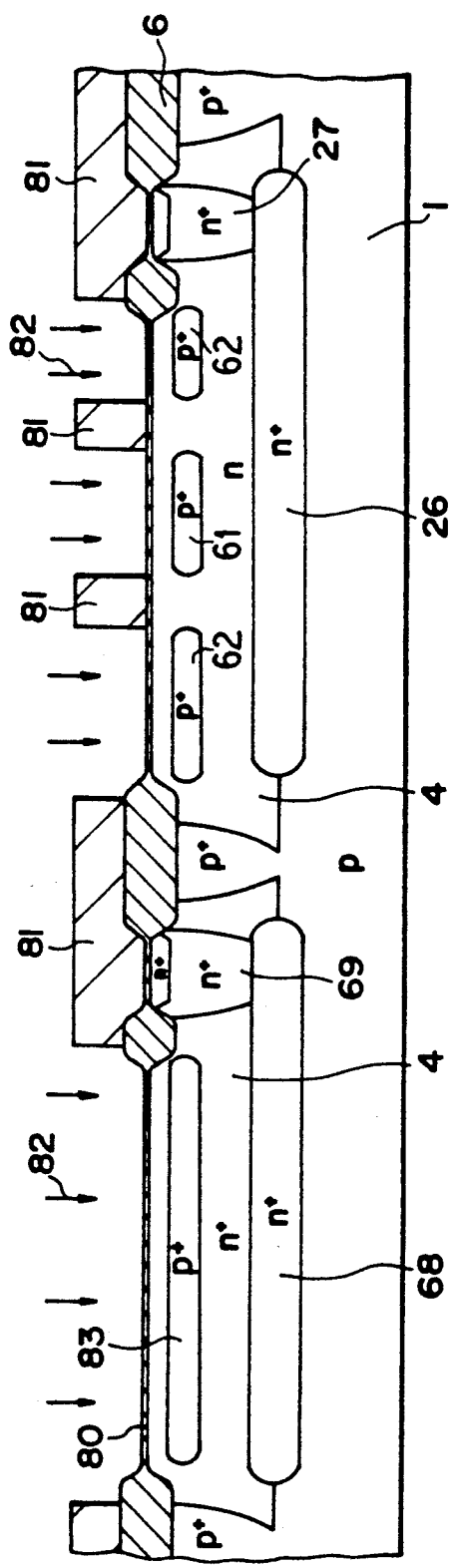

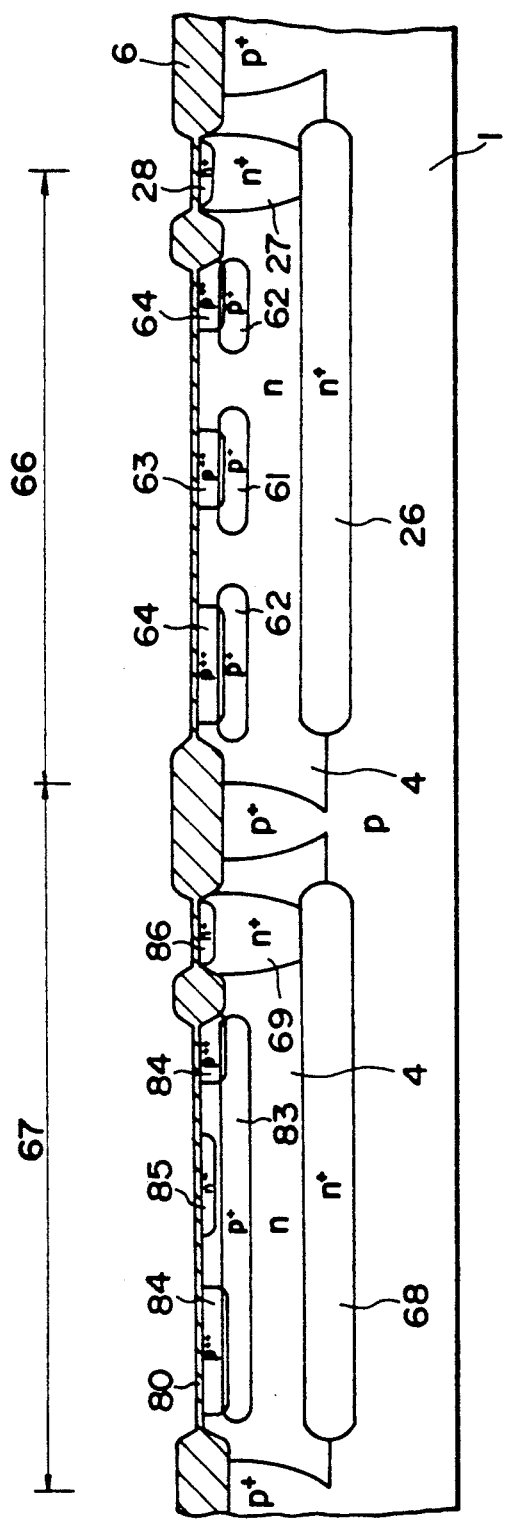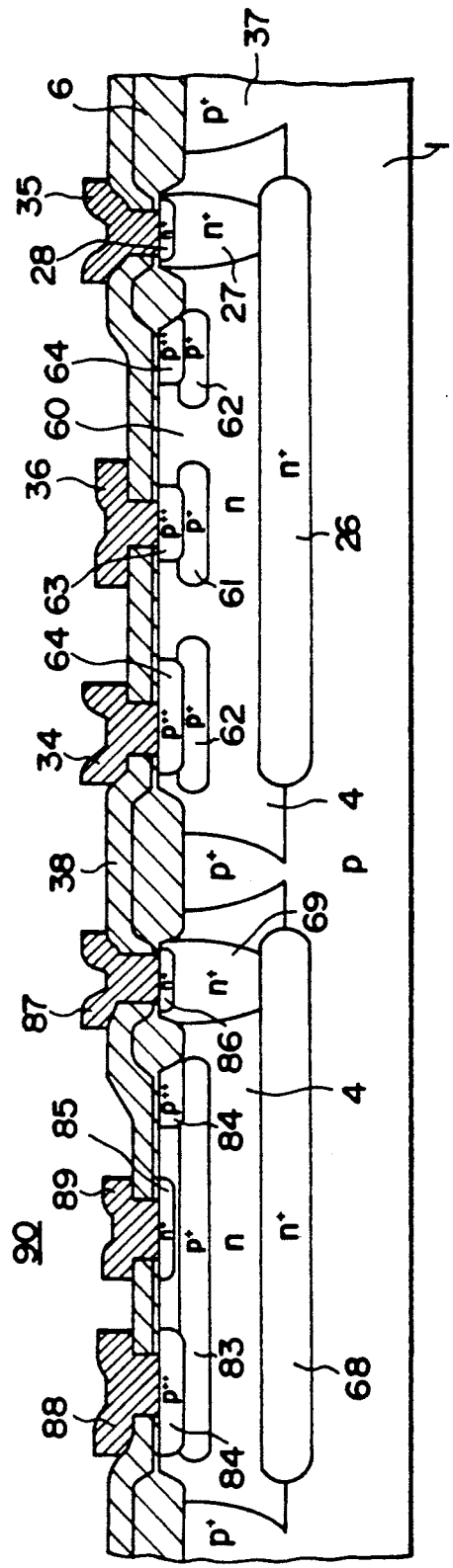
FIG. 4C
FIG. 4D

Impurity Concentration

Impurity Concentration

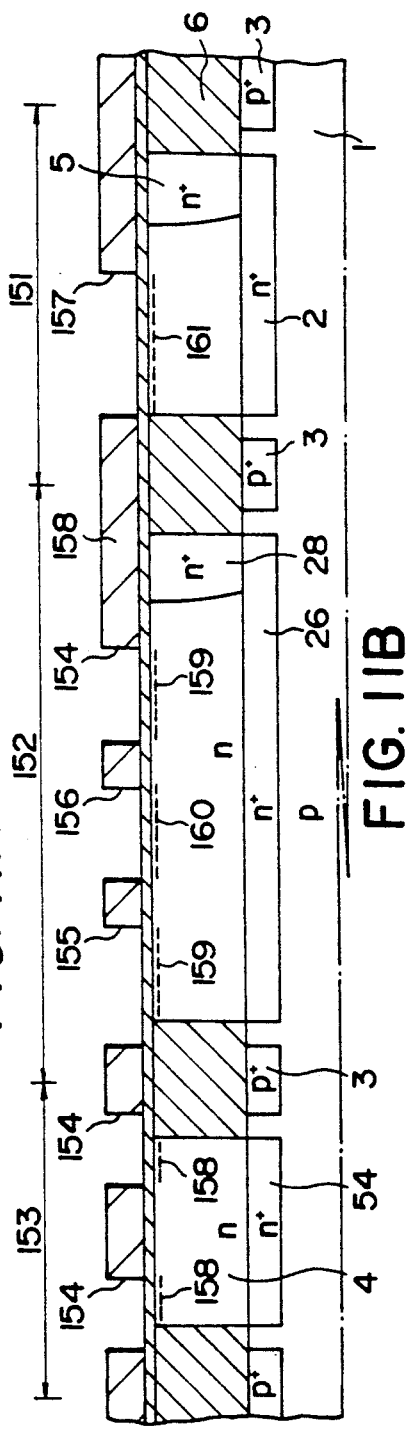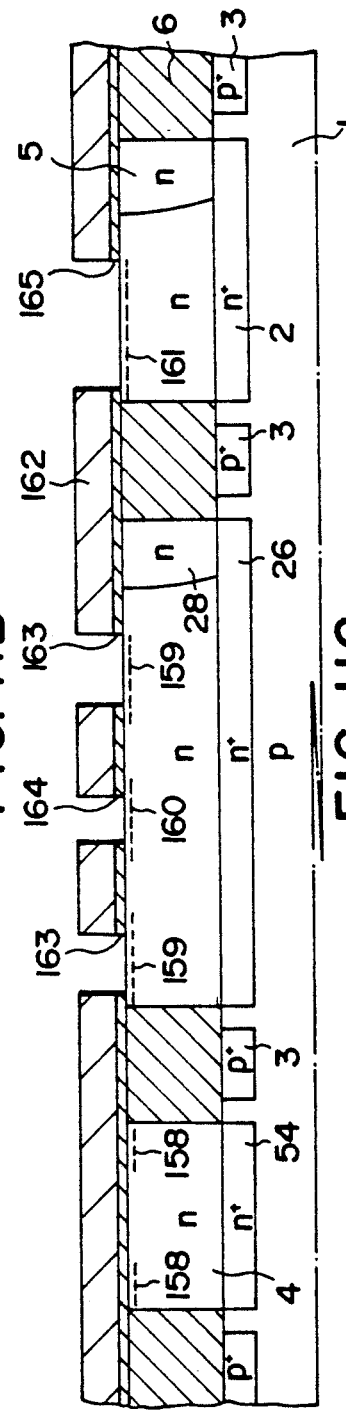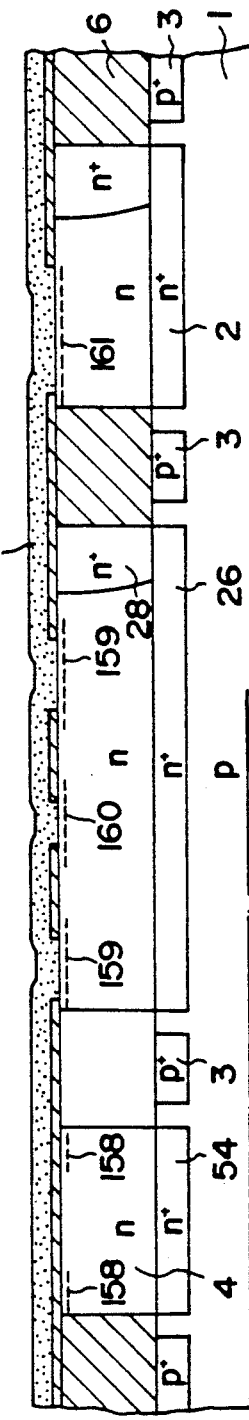

SEMICONDUCTOR DEVICE HAVING ENHANCED IMPURITY CONCENTRATION PROFILE

BACKGROUND OF THE INVENTION

1. Field of the Invention

The present invention relates to a semiconductor device and a method of fabricating the same. More particularly, the present invention relates to the structure of a lateral bipolar junction transistor and a method of fabricating a lateral bipolar junction transistor for a high-performance bipolar LSI comprising a lateral bipolar junction transistor, a vertical bipolar junction transistor and a Schottky barrier diode, and a method of fabricating such a high-performance bipolar LSI.

2. Description of the Prior Art

A known very-high-speed bipolar junction transistor has a base contact electrode and an emitter contact electrode formed of a polycrystalline silicon film, and a base region and an emitter region formed by the diffusion of the impurity from the polycrystalline silicon film forming the emitter contact electrode in a self-alignment mode. FIGS. 21A, 21B, 21C and 21D show the very-high-speed bipolar junction transistor in different steps of the fabricating process. As shown in FIG. 21A, an n-type epitaxial layer 4 is formed after forming an embedded collector region 2 of a second conduction type, for example, n-type, and a p-type channel stop region 3 in one of the major surfaces of a silicon substrate 1 of a first conduction type, for example, p-type, a heavily doped n-type collector contact region 5 is formed so as to reach the embedded collector region 2, and then a field insulating film 6 is formed by local oxidation over the entire surface excluding the collector electrode region, and a region 4A in which a base region and an emitter region are to be formed afterward. Subsequently, a thin insulating film 7, such as a thin $SiO_2$ film, is formed over the entire surface, a portion of the thin insulating film 7 corresponding to the region 4A is removed, a first polycrystalline silicon film 8, which serves as a base contact electrode, by a CVD process (chemical vapor deposition process), and then the polycrystalline silicon film 8 is doped with a p-type impurity, i.e., boron. Then, the $p^+$-type polycrystalline silicon film 8 is patterned by using a first resist mask 9 having the pattern of the base contact electrode.

Then, as shown in FIG. 21B, a $SiO_2$ film 10 is formed over the entire surface including the patterned $p^+$-type polycrystalline silicon film 8 by a CVD process, and then a second resist mask 11 is formed. Portions of the $SiO_2$ film 10 and the $p^+$-type polycrystalline silicon film 8 corresponding to an active region, in which an intrinsic base region and an emitter region are to be formed, are removed by selective etching using the resist mask 11 to form a window 13 and a base contact electrode 12 formed of the $p^+$-type polycrystalline silicon film 8.

Then, as shown in FIG. 21C, the region 4A is doped through the window 13 with a p-type impurity, i.e., boron, by ion implantation to form a link base region 14 for connecting an external base region and an intrinsic base region to be formed on the region 4A afterward. Then, a $SiO_2$ film is formed by a CVD process, and then the $SiO_2$ film formed by the CVD process is densified through a heat treatment in which the $SiO_2$ film is heated at a temperature on the order of 900° C. During the heat treatment of the $SiO_2$ film, boron contained in the base contact electrode 12 formed of the $p^+$-type polycrystalline silicon film is caused to diffuse into the region 4A to form part of an external base region 16. Then, a $SiO_2$ side wall 15 is formed over the inner surface of the base electrode 12 facing the window 13.

Then, as shown in FIG. 21D, a second polycrystalline silicon film 18 for an emitter contact electrode is deposited by a CVD process in a window 17 defined by the side wall 15. Then, the polycrystalline silicon film 18 is doped by ion implantation with a p-type impurity, such as B or $BF_2$, and annealed to form a p-type intrinsic base region 19 in the active region, and then, the p-type base region 19 is doped by ion implantation with an n-type impurity, such as As, and annealed to form an n-type emitter region 20. In another method, the polycrystalline silicon film 18 is doped by ion implantation with p-type and n-type impurities and annealed to form the p-type intrinsic base region 19 and the n-type emitter region 20. During the annealing process for forming the base region 19 and the emitter region 20, boron contained in the base contact electrode 12 formed of $p^+$-type polycrystalline silicon is caused to diffuse to complete the external base region 16. The impurity concentration of the intrinsic base region 19 is higher than that of the link base region 14. Then, contact holes are formed, and then a base electrode 21, a collector electrode 22 and an emitter electrode 23 of a metal, such as aluminum, are formed to complete a very-high-speed bipolar transistor 24.

A high-performance bipolar junction transistor LSI comprising such an npn bipolar junction transistor, a lateral pnp bipolar junction transistor, a Schottky diode with a guardring and a LEC (low emitter concentration) transistor formed on a semiconductor substrate is being developed.

FIG. 16 shows the structure of a lateral pnp bipolar junction transistor 40. The lateral pnp bipolar junction transistor 40 is constructed by forming an n-type epitaxial layer 4 over an n-type embedded base region 26 formed on a p-type silicon substrate 1, forming a field insulating film 6 by selective oxidation, forming an n-type plug-in region 27 reaching the n-type embedded base region 26, and an n-type base contact region 28, forming a p-type collector region 32 and a p-type emitter region 33 respectively having heavily doped p-type regions 30 and 31, and forming an aluminum collector electrode 34, an aluminum base electrode 35 and an aluminum emitter electrode 36. In FIG. 16, indicated at 37 is a p-type isolating region, at 38 is a layer insulating film and at 39 is a thin $SiO_2$ film. In most cases, the p-type collector region 32 and the p-type emitter region are formed at the same time with the p-type intrinsic base region 19 of the npn bipolar junction transistor 24, and the heavily doped p-type regions 30 and 31 are formed at the same time with the external base region 16 of the npn bipolar junction transistor 24. The base width $W_B$ is determined by the p-type collector region 32 and the p-type emitter region 33. FIG. 17 shows the impurity concentration profile of a section along an alternate long and short dash line 41. The impurity concentration profile has a peak at a position corresponding to a portion near the surface of the substrate as shown in FIG. 17, because the surface is doped by ion implantation with boron and boron is caused to diffuse in forming the p-type collector region 32 and the p-type emitter region 33. Accordingly, the collector region 32 and the emitter region are nearest in the vicinity of the surface.

FIG. 18 shows the structure of another lateral pnp bipolar junction transistor 42, in which portions corresponding to those of the lateral pnp bipolar junction transistor shown in FIG. 16 are denoted by the same reference characters and the description thereof will be omitted to avoid duplication. In fabricating the lateral pnp bipolar junction transistor 42, a base contact region 28 is formed simultaneously with the collector contact region 5 of a npn bipolar junction transistor 24, and a p-type emitter region 33 and a p-type collector region 32 are formed simultaneously with the external base region 16 of the npn bipolar junction transistor 24 through the diffusion of boron from a contact electrodes 44 and 43 formed of p+-type polycrystalline silicon. Indicated at 3 is a p-type channel stop region.

FIG. 20 shows the structure of a Schottky barrier diode 51 with a guard ring. The Schottky barrier diode 51 has a p+-type guard ring region 52 along the periphery of a field insulating film 6 isolating a n-type region 4B. An electrode 53 is formed in a Schottky junction on the n-type region 4B, and an electrode 56 is formed in ohmic contact through an n-type contact region 55 with an embedded region 54.

A process for forming the intrinsic base region 19 and emitter region 20 of the npn bipolar junction transistor 24 (FIG. 21D) through the double diffusion of the polycrystalline silicon film 8 in fabricating the high-performance bipolar LSI provided with the npn bipolar junction transistor 24, the lateral pnp bipolar junction transistor 40 (or 42, FIGS. 16 and 18) and the Schottky barrier diode 51 (FIG. 20) with a guard ring includes a step of forming the link base region 14 through the ion implantation of boron at a dose on the order of $10^{13}/cm^2$, a step of forming the guard ring region 52 of the Schottky barrier diode 51 through the ion implantation of boron at a dose on the order of $10^{13}/cm^2$ and a step of forming the collector region 32 and emitter region 33 of the lateral pnp transistor through the ion implantation of boron at a dose in the range of $10^{13}$ to $10^{14}/cm^2$. In most cases, these steps are carried out individually for the following reason.

(i) Since the link base region 14 is formed in a depth as small as possible, so-called parasitic transistor action in the link base region has an influence when the bipolar LSI operates in a high current range. Therefore, portions that acts as a parasitic transistor must be reduced to the least extent by forming the link base region 14 in a small depth and hence the step of forming the link base region 14 is performed as late as possible.

(ii) The guard ring region 52 must be subjected to ion implantation before forming the polycrystalline silicon film 8, which serves as contact electrodes, by CVD.

(iii) The dose of the lateral pnp transistor is higher than those of others to provide a high current amplification factor $h_{FE}$ by increasing emitter injection efficiency.

The current amplification factor $h_{FE}$ of the lateral pnp transistor 40 shown in FIG. 16 is reduced due to surface recombination because the current flows mainly along the surface, i.e., the vicinity of the interface of the $SiO_2$ film 39, and the current amplification factor $h_{FE}$ is liable to be unstable due to the variation of the surface recombination electrode depending on the condition of the interface of the $SiO_2$ film 39.

As shown in FIG. 19, the base width $W_B$ of the lateral pnp transistor 42 shown in FIG. 18 is not dependent on the minimum line width achieved by lithography, but is dependent on several factors as expressed by:

$$W_B = a + 2b - 2c$$

where a is the minimum line width achieved by lithography, b is the width of overlaps in which the $SiO_2$ film 19 and the p+-type polycrystalline silicon films 43 and 44 overlap each other, and c is the width of areas of side diffusion of the p+-type diffused regions of the emitter 32 and the collector 33.

For example, when the minimum line width a=1.2 μm, a stepping projection aligner of ±0.3 μm aligning accuracy is employed, and the junction depth $X_j$ of the p+-type diffused regions 32 and 33 is 0.2 μm, $$W_B = 1.2 \ \mu m + 2 \times 0.8 \ \mu m - 2 \times 0.8 \times 0.2 \ \mu m \approx 2.48 \ \mu m$$

The base width $W_B$ is approximately twice as large as the minimum line width a, and hence it is impossible to provide the lateral pnp transistor 42 with a high $f_T$.

SUMMARY OF THE INVENTION

The present invention is intended to prevent surface recombination in a lateral bipolar junction transistor having a collector region, a base region and an emitter region formed in a lateral arrangement of a semiconductor substrate and to improve and stabilize the current amplification factor of the lateral bipolar junction transistor by forming the respective portions having peak impurity concentrations of the collector region and the emitter region within the semiconductor substrate.

A method of fabricating a lateral bipolar junction transistor in accordance with the present invention comprises a step of forming a collector region of a second conduction type and an emitter region of a second conduction type in a lateral arrangement in a semiconductor substrate serving as a base region of a first conduction type by using a first mask provided with a pair of openings, and a step of forming heavily doped regions of a second conduction type connected respectively to the collector region and the emitter region by using a second mask provided with openings separated from each other by a distance greater than that between the openings of the first mask. Thus, the present invention reduces the base width $W_B$ to provide a high $f_T$ and a high $h_{FE}$.

According to the present invention, in a method of fabricating a semiconductor device having a lateral bipolar junction transistor, a vertical bipolar junction transistor and a Schottky barrier diode with a guard ring formed on a common semiconductor substrate, a emitter region and a collector region for the lateral transistor, a guard ring region for the Schottky barrier diode, and a link base region for the vertical transistor are formed simultaneously by doping with the same impurity by using a mask provided with openings. Thus, the present invention curtails the fabricating steps without sacrificing performance.

Accordingly, it is an object of the present invention to provide a method of fabricating a lateral bipolar junction transistor, capable of reducing the base width $W_B$ to the minimum line width to provide the lateral bipolar junction transistor with a high $f_T$ and a high $h_{FE}$.

It has been desired to simplify the process of fabricating the high-performance bipolar LSI provided with the npn bipolar junction transistor, the lateral pnp bipolar junction transistor and the Schottky diode. If the link base region 14, the guard ring region 52 and the emitter region 33 and collector region 32 of the lateral pnp transistor can be formed in the same process, two ion implanation processes and two window forming processes can be omitted. In a large-scale integrated circuit, and the Schottky TTL circuit requires a Schottky barrier diode, the active pull-down circuit of the ECL circuit requires the lateral pnp transistor. However, the link base region 14 need not be formed in a small depth because the operating current is in a lower range. Therefore these above regions are formed at the same time Accordingly, it is another object of the present invention to provide a simple method of fabricating a high-performance bipolar LSI.

A semiconductor device (a so-called lateral transistor) in accordance with the present invention comprises a semiconductor substrate 4 provided with a collector region 62, a base region 60 and an emitter region 61 in a lateral arrangement, wherein respective portions having peak impurity concentrations of the collector region and the emitter region are formed within the semiconductor substrate 4 and not near the surface.

A method of fabricating a semiconductor device (a so-called lateral transistor), in accordance with the present invention comprises a step of forming a collector region 132 of a second conduction type and an emitter region 133 of the second conduction type in a lateral arrangement in a semiconductor substrate 1 of a first conduction type by using a first mask 123 provided with a pair of openings 121 and 122; and a step of forming heavily doped regions 130 and 131 of the second conduction type so as to be connected respectively to the collector region 132 and the emitter region 133 by using a second mask 127 provided with a pair of openings separated from each other by a distance $d_2$ greater than the distance $d_1$ between the openings of the first mask 123.

A method of fabricating a semiconductor device (a so-called high-performance bipolar transistor LSI) comprising a semiconductor substrate provided with a lateral transistor, a vertical transistor and a Schottky barrier diode with a guard ring comprises a step of simultaneously doping regions in the semiconductor substrate with the same impurity by using a single mask 158 provided with a plurality of openings 154, 155, 156 and 157 to form simultaneously an emitter region 160 and a collector region 159 for the lateral transistor, a guard ring region 158 for the Schottky barrier diode, and a link base region 161 for the vertical transistor.

In the semiconductor device in the first aspect of the present invention, the collector region 62 and emitter region 61 of the lateral transistor are formed so that portions thereof having the maximum impurity concentration are formed within the substrate 4 to form a main current path within the substrate 4 instead of near the surface of the same, which prevents the reduction of $h_{FE}$ due to surface recombination. The small variation of the surface recombination current due to the condition of the surface of the oxide film stabilizes the $h_{FE}$. Thus, the lateral transistor has a stable, high $h_{FE}$.

In the method of fabricating a lateral transistor in the second aspect of the present invention, the collector region 132 and the emitter region 133 are formed by using the first mask 123, and the heavily doped regions 130 and 131 of the collector region and the emitter region are formed by using a second mask 127. Accordingly, the pair of openings 121 and 122 of the first mask 123 can be separated from each other by the distance $d_1$ corresponding to the minimum line width which can be achieved by lithography. Accordingly, the collector region 132 and the emitter region 133 can be formed so that the base width $W_E$ corresponds to the minimum line width to achieve a high $f_T$. Since the collector electrodes 43 and 134 and the emitter electrodes 44 and 136 are formed by using the second mask provided with the openings 125 and 126, the collector electrodes 43 and 134 and the emitter electrodes 44 and 136 can easily be isolated from each other.

Since the emitter region 133 has a heavily doped region 131, the emitter injection efficiency is high and the $h_{FE}$ is improved.

Thus, a lateral transistor having a high $f_T$ and a high $h_{FE}$ can be fabricated.

In the method of fabricating a high-performance bipolar LSI in the third aspect of the present invention, the emitter region 160 and collector region 159 of a lateral transistor, the guard ring region 158 of the Schottky barrier diode and the link base region 161 of a vertical transistor are formed simultaneously by using the single mask 158 provided with the openings 154, 155, 156 and 157, steps of the process of fabricating the high-performance bipolar LSI can be curtailed without sacrificing the performance.

BRIEF DESCRIPTION OF THE DRAWINGS

The above and other objects, features and advantages of the present invention will become more apparent from the following description taken in connection with the accompanying drawings, in which:

FIGS. 4A to 4D are sectional views of assistance in explaining steps of a method of fabricating the lateral bipolar transistor of FIG. 1 and a LEC transistor;

FIGS. 11A to 11G are sectional views of assistance in explaining steps of a method of fabricating a high-performance bipolar LSI, embodying the present invention;

DETAILED DESCRIPTION OF THE PREFERRED EMBODIMENTS

Figure 1:
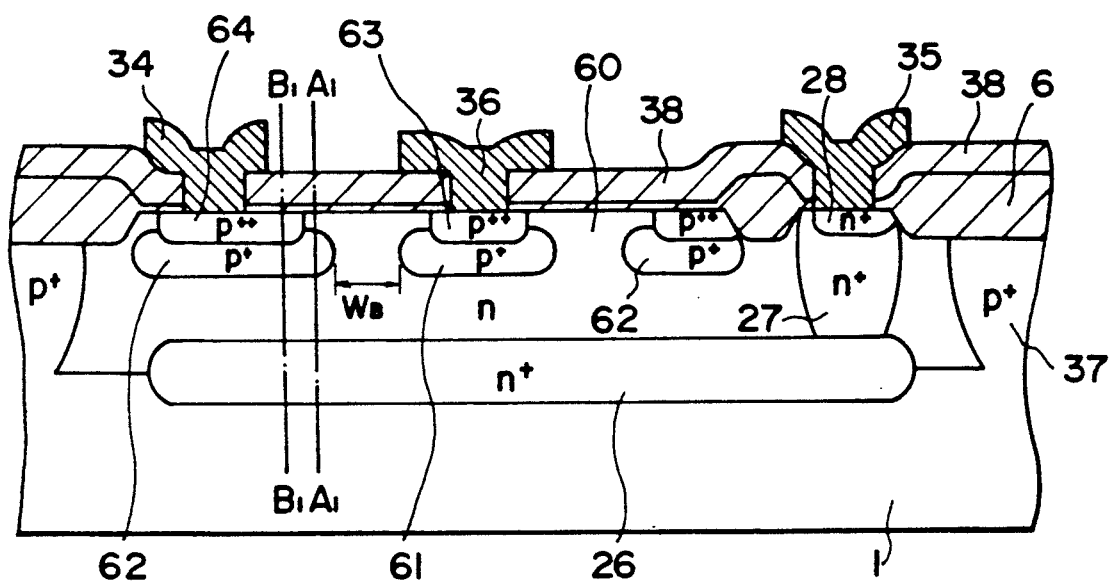
FIG. 1 is a sectional view of a lateral bipolar transistor in a preferred embodiment according to the present invention.

FIG. 1 shows a lateral pnp transistor in a first embodiment according to the present invention.

According to the present invention, an embedded n-type base region 26 and an n-type epitaxial layer 4 are formed on a p-type silicon substrate 1, a p-type isolation region 37, and a selectively oxidized (LOCOS) field insulating layer 6 are formed and n-type plug-in region 27 reaching the embedded n-type base region 26, and an n-type base contact region 28 are formed.

A p-type emitter region 61 and a p-type collector region 62 are formed in a lateral arrangement so that portions thereof respectively having maximum impurity concentrations are within the n-type epitaxial layer 4, which serves as a base region 60, with a distance corresponding to a base width $W_B$ therebetween, and then heavily doped p-type regions 63 and 64 are formed so as to be joined respectively to the emitter region 61 and the collector region 62. Subsequently, a layer insulating film 38 is formed, and then a collector electrode 34, a base electrode 35 and an emitter electrode 36, such as aluminum electrodes, are formed in contact holes to complete a lateral pnp bipolar transistor 65.

Figure 2:
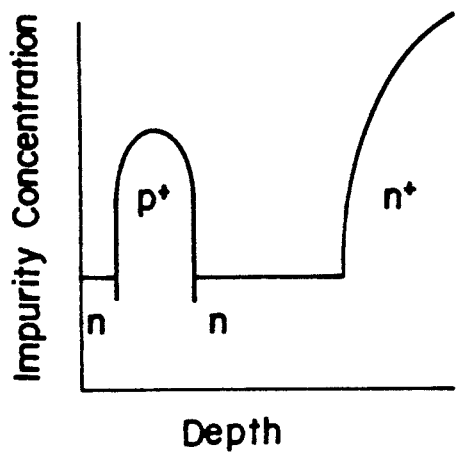
FIGS. 2 and 3 are graphs showing impurity concentration profiles respectively along the lines $A_1$—$A_1$ and $B_1$—$B_1$ in FIG. 1.
Figure 3:
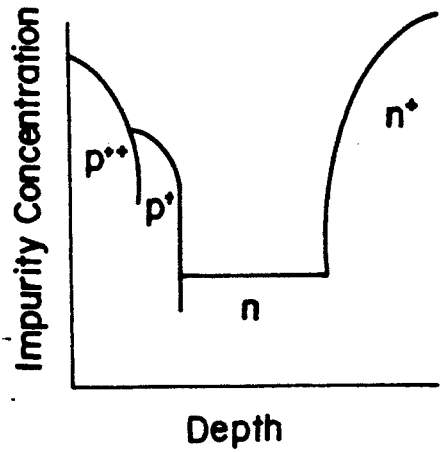

FIG. 2 shows the variation of impurity concentration with depth along the line $A_1—A_1$ in FIG. 1, and FIG. 3 shows the variation of impurity concentration with depth along the line $B_1—B_1$ in FIG. 1.

FIGS. 4A, 4B, 4C and 4D are sectional views showing the lateral pnp bipolar transistor 65 in different steps of a fabricating process. In this case, the lateral pnp bipolar transistor like the transistor 65 is fabricated together with a low emitter concentration transistor featured by its high $V_{EBO}$, low $C_{BE}$ and low noise.

As shown in FIG. 4A, an embedded n-type base region 26 and an embedded n-type collector region 68 are formed respectively in a lateral pnp transistor forming section 66 and a LEC transistor forming section 67 of a p-type silicon substrate 1, an n-type epitaxial layer 4 is formed, and then p-type isolation regions 37 and a field insulating layer 6 are formed. When necessary, an n-type plug-in region 27 reaching the embedded n-type base region 26, and an n-type plug-in region 69 reaching the embedded n-type collector region 68 are formed respectively in the sections 66 and 67. Indicated at 80 is a thin $SiO_2$ film.

Then, as shown in FIG. 4B, a p-type emitter region 61 and a p-type collector regions 62 are formed in the section 66 so that portions thereof having maximum impurity concentrations are formed within the epitaxial layer 4, which serves as a base region, and, simultaneously, a p-type base region 83 for the LEC transistor is formed in the section 67 by ion implantation using a p-type impurity 82, such as boron, a resist mask 81 and energy of 180 keV or higher.

Then, as shown in FIG. 4C, heavily doped p-type regions 64 and 63, i.e., a p-type collector contact region and a p-type emitter contact region, are formed in the section 66 and, at the same time, a p-type base contact region 84 for the LEC transistor is formed in the section 67. An n-type emitter region 85 for the LEC transistor is formed in the section 67. An n-type collector contact region 86 for the LEC transistor is formed and an n-type base contact region 28 for the lateral pnp transistor is formed in the section 16 simultaneously with the formation of the n-type emitter region.

Then, as shown in FIG. 4D, contact holes are formed after forming a layer insulating film 38, and then collector electrode 34 and a base electrode 35 and an emitter electrode 36, such as aluminum electrodes, are formed in the section 66 to complete the lateral pnp bipolar transistor 65 and a collector electrode 87, a base electrode 88 and an emitter electrode 89, such as aluminum electrodes, are formed in the section 67 to complete the LEC npn transistor 90.

In the lateral pnp bipolar transistor 65 thus fabricated, portions of the collector region 62 and the emitter region 61 respectively having maximum impurity concentrations are formed within the bulk and portions of the collector region 62 and the emitter region 61 nearest to each other are formed within the bulk to form a principal current passage within the bulk instead of near the surface. Consequently, reduction in current amplification factor $h_{FE}$ due to surface recombination is prevented to provide a lateral bipolar transistor having a high $h_{FE}$. Instability in the $h_{FE}$ due to the condition of the interface of the oxide film ($SiO_2$ film) is remo namely, change in the surface recombination cur due to the condition of the interface of the oxide film is reduced to stabilize the $h_{FE}$.

Figure 5:
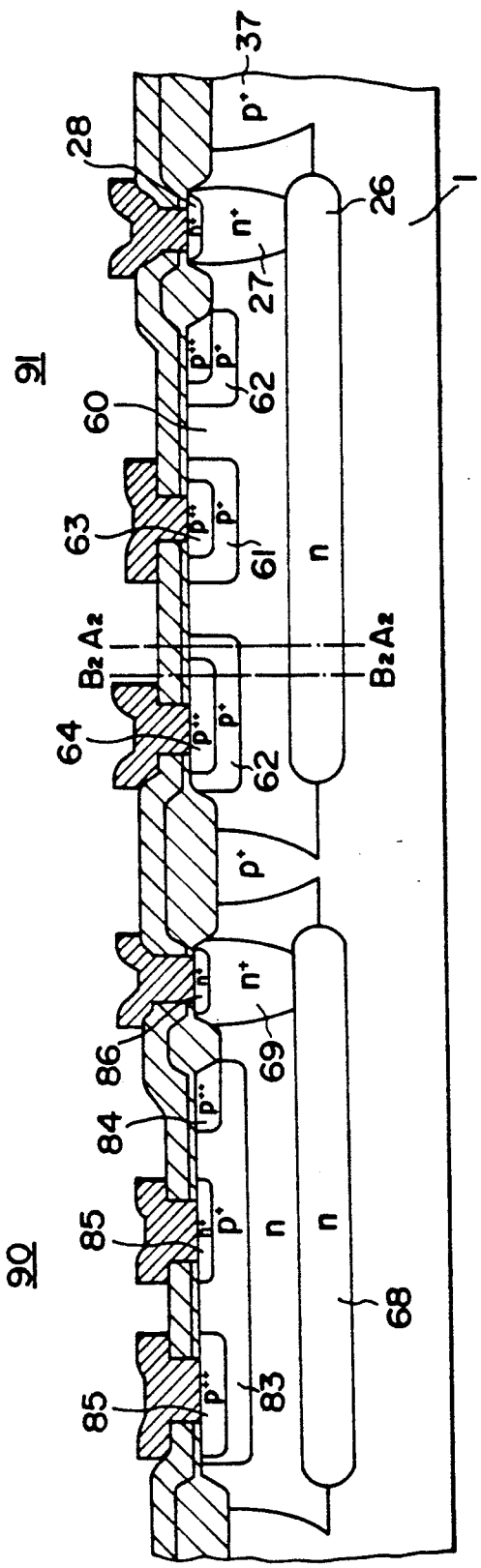
FIG. 5 is a sectional view of a semiconductor device comprising a lateral bipolar transistor and a LEC transistor according to the present invention.

FIG. 5 shows a lateral pnp bipolar transistor 91 in a second embodiment according to the present invention, in which parts corresponding to those shown in FIGS. 4A to 4D are denoted by the same reference characters and the description thereof will be omitted to avoid duplication. The collector region 62 and the emitter region 61 of the lateral pnp bipolar transistor 91 are formed by doping the corresponding regions with a p-type impurity by ion implantation using high energy in the range of 100 to 150 keV, and then the collector region 62 and the emitter region 63 are subjected to a heat treatment to make the impurity diffuse into the surface epitaxial layer 4 so that portions respectively having maximum impurity concentrations of the collector region 62 and the emitter region 63 are formed within the bulk as shown in FIG. 6.

Figure 7:
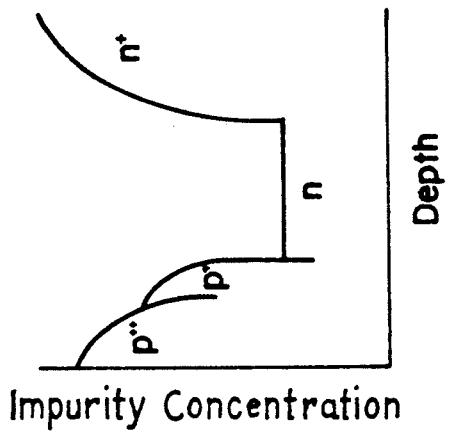
FIGS. 6 and 7 are graphs showing impurity concentration profiles respectively along the lines $A_2$—$A_2$ and $B_2$—$B_2$ in FIG. 5.
Figure 6:
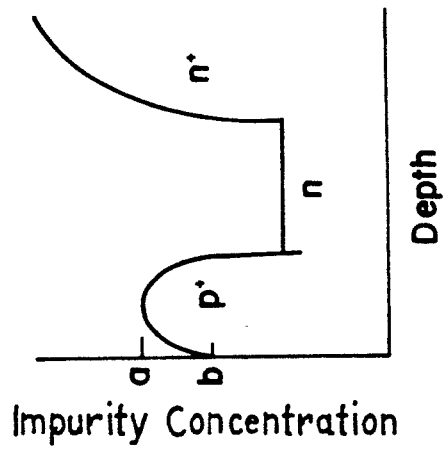

FIG. 6 shows the profile of impurity concentration along the line $A_2—A_2$ in FIG. 5, and FIG. 7 shows the profile of impurity concentration along the line $B_2—B_2$ in FIG. 5.

The collector region 62 and the emitter region 61, similarly to those shown in FIG. 1, are formed so that the impurity concentration in the vicinity of the surface is ⅓ the maximum impurity concentration in the bulk or below, namely, $b/a \leq \frac{1}{3}$ as shown in FIG. 6. On the other hand, the base region 83, which is formed simultaneously with the collector region 62 and the emitter region 61, of the LEC transistor 90 is formed, similarly to the collector region 62 and the emitter region 61 of the pnp bipolar transistor 91, so that a portion having a maximum impurity concentration is formed within the bulk, and the impurity concentration in the vicinity of the surface is lower than the maximum impurity concentration.

In the lateral pnp bipolar transistor 91, portions having the maximum impurity concentrations of the collector region 62 and the emitter region 61 are formed within the bulk to form a principal current passage within the bulk instead of near the surface. Consequently, reduction in current amplification factor $h_{FE}$ due to surface recombination is prevented, instability in the $h_{FE}$ due to the condition of the interface of the oxide film is removed to provide the lateral pnp bipolar transistor 91 with a stable, high $h_{FE}$.

Incidentally, a high-speed device requires a high-performance lateral pnp transistor. The performance of the lateral pnp transistor 65 of FIG. 1 can be improved by diminishing the base width $W_B$. However, the epitaxial concentration, in general, is in the range of $5 \times 10^{14}$ to $5 \times 10^{16}/cm^3$. When the lateral pnp transistor is incorporated into a LSI provided with a npn bipolar transistor provided with a base electrode and an emitter electrode formed of polycrystalline silicon as shown in FIG. 21, the epitaxial concentration is not higher than $10^{15}/cm^3$ when the epitaxial layer 4 has a high resistance to reduce the collector junction capacity $C_{JC}$ so that the operating speed of the npn bipolar transistor is enhanced. Accordingly, when the base width $W_B$ of the lateral pnp transistor is diminished to a width not greater than 1.0 μm, the total quantity $Q_B$ of the impurity in the base becomes a value on the order of $10^{11}/cm^2$ and punch through occurs between the emitter and the collector. Thus, it is difficult to improve the performance of the lateral pnp transistor by reducing the base width $W_B$.

Figure 8:
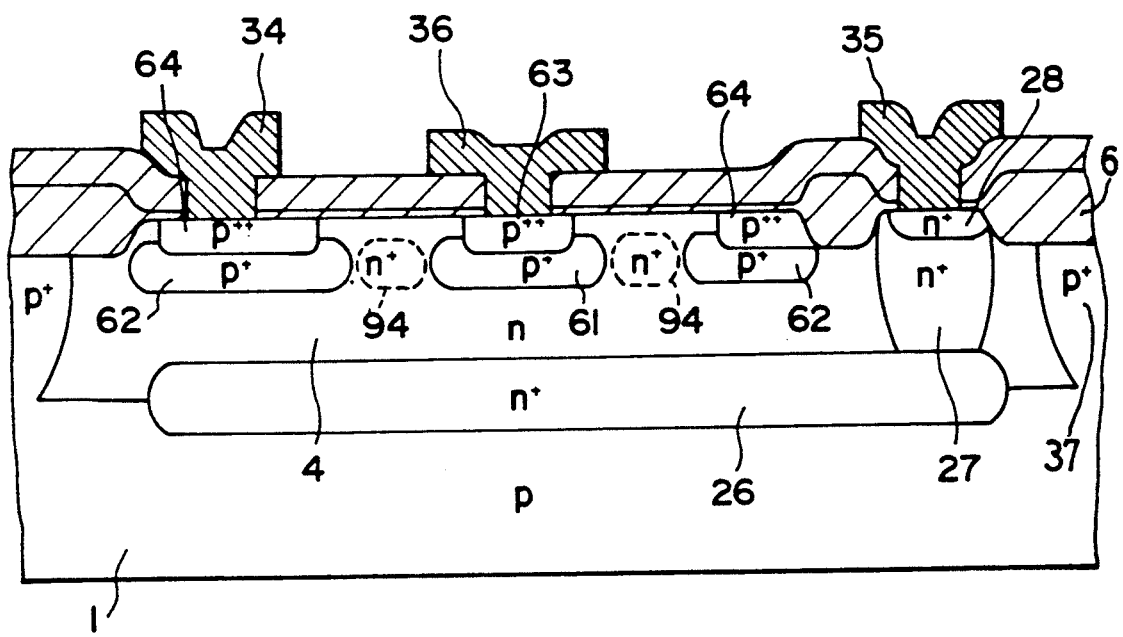
FIG. 8 is a sectional view of a lateral bipolar transistor in a further embodiment according to the present invention.

FIG. 8 shows a high-performance, stable lateral pnp bipolar transistor 93 embodying the present invention developed by solving the foregoing problems.

In FIG. 8, parts corresponding to those shown in FIG. 1 are denoted by the same reference characters. The pnp transistor 93 is fabricated by a process similar to that for fabricating the lateral pnp bipolar transistor shown in FIG. 1. In fabricating the pnp transistor 93, an embedded n-type base layer 26 is formed on a p-type silicon substrate 1, an n-type epitaxial layer 4 is formed over the embedded n-type layer 26, p-type isolation regions 37 and a field insulating layer 6 are formed, and then an n-type plug-in region 27 reaching the embedded n-type base region 27, and an n-type base contact region 28 are formed. A p-type collector region 62 and a p-type emitter region 61 are formed in the epitaxial layer 4 in a lateral arrangement with a spacing corresponding to the base width $W_B$ so that portions of the p-type collector region 62 and the p-type emitter region 61 respectively having maximum impurity concentrations are formed within the bulk. In this embodiment, in particular, a heavily doped n-type region 94 having an impurity concentration higher than that of the epitaxial layer 4 and having a portion having a maximum impurity concentration is formed in an intrinsic region between the p-type collector region 62 and the p-type emitter region 61 on the same level as that on which the portions having the maximum impurity concentrations of the p-type collector region 62 and the p-type emitter region 61 are formed. The n-type region 94 must be formed so that the same may not overlap the collector region 62 and a p+-type emitter region 61.

The heavily doped n-type region 94 having an impurity concentration higher than that of the epitaxial layer 4 and formed between the collector region 62 and the emitter region 61 prevents punch through attributable to the reduction in the base width $W_B$. The n-type region 94 not overlapping the collector region 62 and the emitter region 61 prevents increase in junction capacity. Thus, a stable, high-performance pnp transistor can easily fabricated.

Figure 9A:
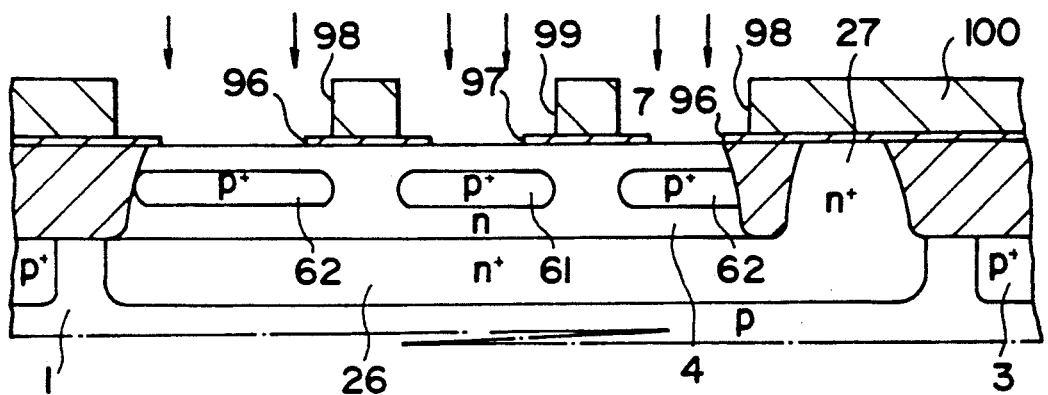
FIGS. 9A to 9C are sectional views of assistance in explaining steps of a method of fabricating the lateral bipolar transistor of FIG. 8.
Figure 21A:
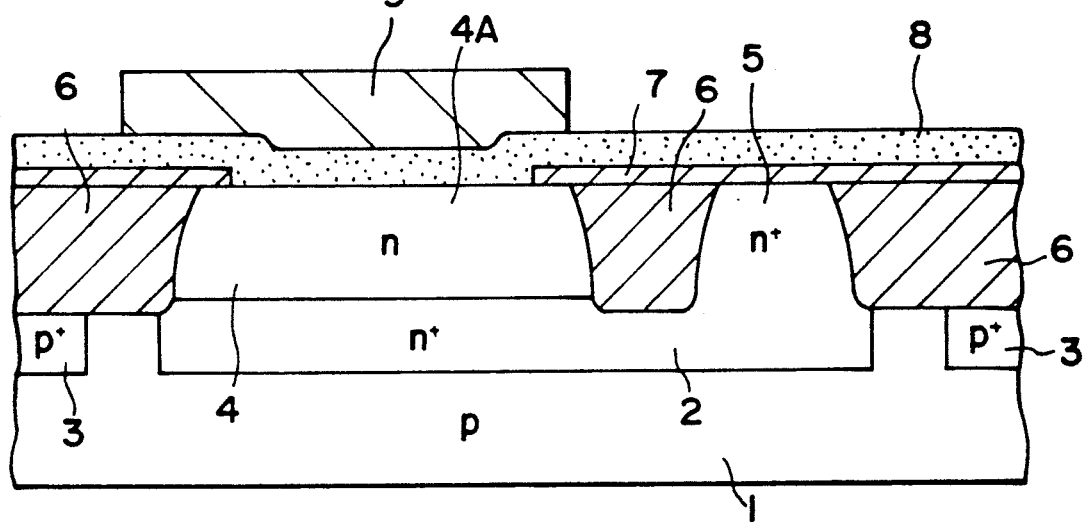
FIGS. 21A to 21D are sectional views of assistance in explaining steps of a conventional method of fabricating a very-high-speed bipolar transistor.

A method of fabricating the lateral pnp transistor 93 simultaneously with the npn bipolar transistor 24 shown in FIG. 21 will be described hereinafter with reference to FIGS. 9A, 9B and 9C, in which only the lateral pnp transistor 93 is shown. As shown in FIG. 9A, an n-type epitaxial layer 4 having an impurity concentration of $10^{15}/cm^3$ or below is formed over an embedded n-type base layer 26 and p-type channel stop regions 3 formed on a p-type silicon substrate 1, a field insulating layer 6 for element isolation is formed by selective oxidation, a thin SiO$_2$ film 7 is formed, and then an n-type base contact region 27 reaching the embedded base layer 26 is formed. Subsequently, collector openings 96 and an emitter opening 97 are formed in the thin SiO$_2$ film 7, and then p-type collector regions 62 and a p-type emitter region 61 are formed with a spacing corresponding to the base width $W_B$ therebetween so that portions respectively having maximum impurity concentrations are formed within the epitaxial layer 4 through the ion implantation of a p-type impurity, such as boron, by using a resist mask 100 having openings 98 and 99 of a size greater than that of the openings 96 and 97, namely, openings 98 and 99 spaced apart by a distance smaller than that between the openings 96 and 97. The openings 96 and 97 in the thin SiO$_2$ film 7 are formed simultaneously with an opening corresponding to a region including the base contact region, intrinsic base region and an active region in which an emitter region is to be formed of the npn bipolar transistor 24 (FIG. 21A).

Figure 9B:
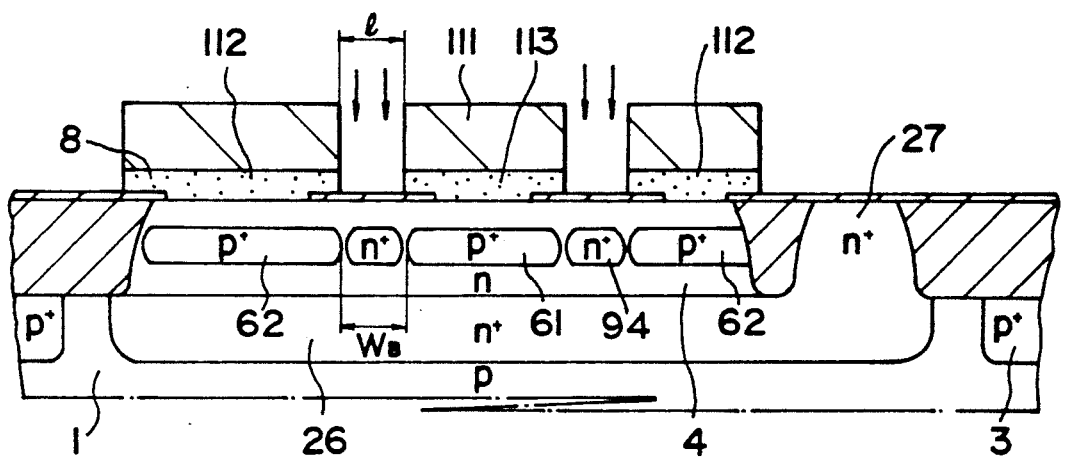
Figure 21B:
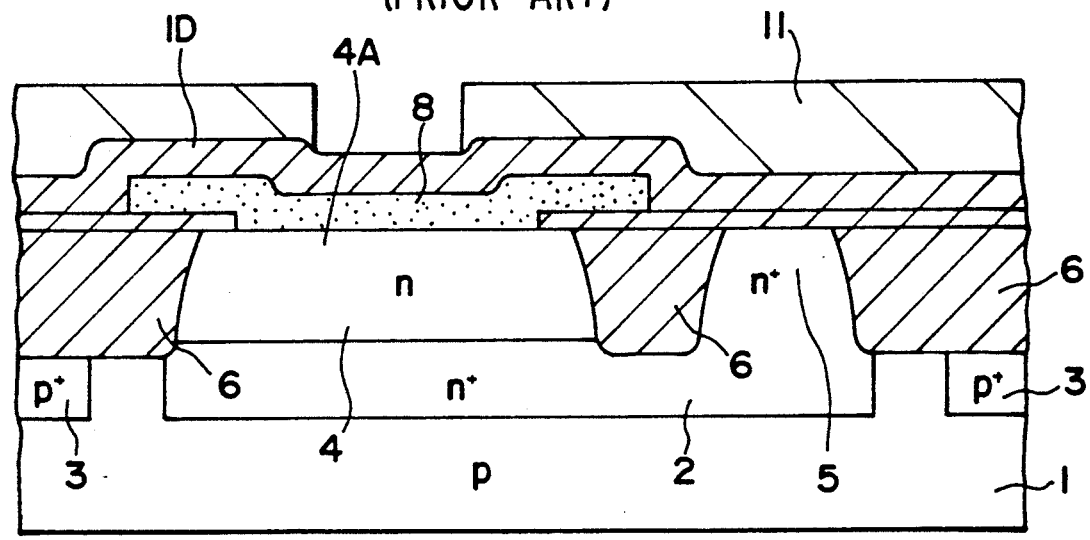
Figure 21C:
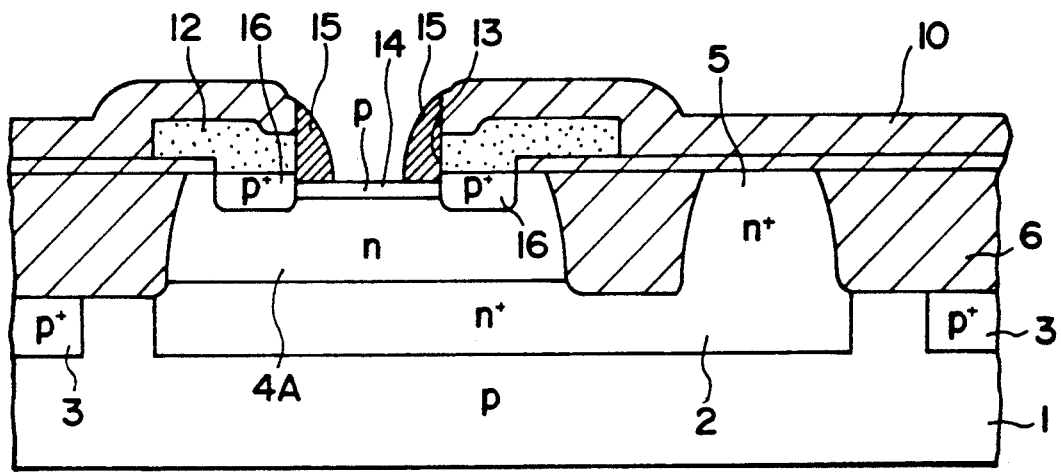
Figure 21D:
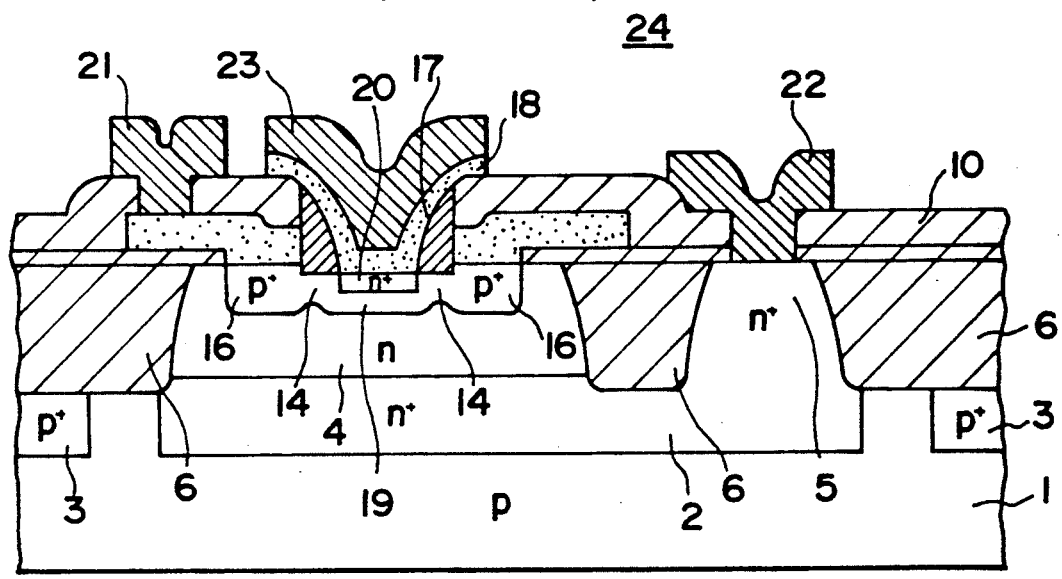

Then, as shown in FIG. 9B, the resist mask 100 is removed, a polycrystalline silicon film 8 is deposited by a CVD process over the entire surface including the openings 96 and 97, the polycrystalline silicon film 8 is doped with a p-type impurity, such as boron, by ion implantation, and then the polycrystalline silicon film 8 is patterned by using a resist mask 111 to form collector contact electrodes 112 and an emitter contact electrode 113 of a p+-type polycrystalline silicon film. The interval l between the electrodes 112 and 113 corresponds to the base width $W_B$, namely, the interval between the collector region 62 and the emitter region 61. A portion of the p+-type polycrystalline silicon film in the npn bipolar transistor 24 is patterned so that the shape of the remaining portion of the p+-type polycrystalline silicon film corresponds to the external shape of the base contact electrode (FIG. 21B). Then, the epitaxial layer 4 is doped with an n-type impurity, such as arsenic, by ion implantation by using the same resist mask 111 to form a n-type region 94 having an impurity concentration on the order of $10^{17}/cm^3$ (a dose on the order of $10^{12}/cm^2$) in the intrinsic base regions between the collector regions 62 and the emitter region 61 so that portions respectively having maximum impurity concentrations of the doped regions are on a level the same as that on which the portions having the maximum impurity concentrations of the collector regions and the emitter region are formed.

Figure 9C:
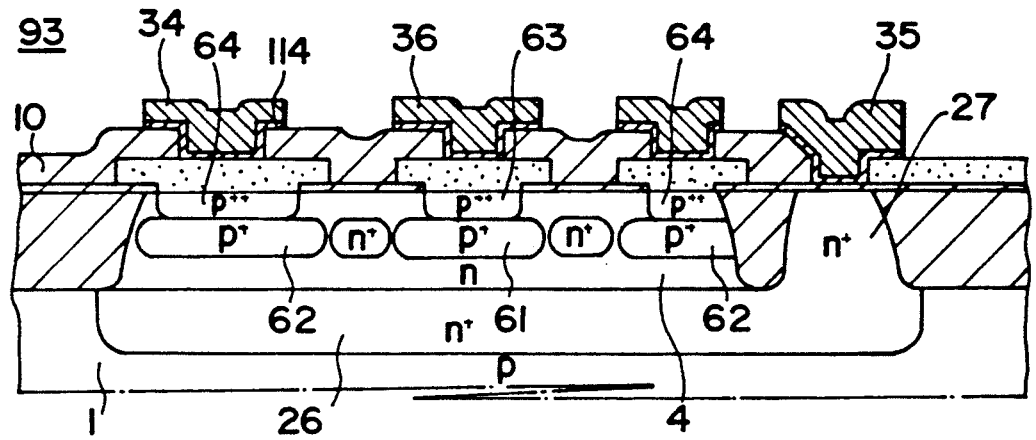

Then, as shown in FIG. 9C, the entire surface is coated with a SiO$_2$ film 10. Thereafter, in the section for the npn bipolar transistor, the SiO$_2$ film 10 and the p$^+$-type polycrystalline silicon film 8 are patterned simultaneously to form a base contact electrode 12 of p$^+$-type polycrystalline silicon and an opening is formed to expose the active region. Subsequently, side walls are formed and boron is caused to diffuse from the collector contact electrodes 112 and the emitter contact electrode 113 formed of the p$^+$-type polycrystalline silicon film to form heavily doped collector regions 64 and a heavily doped emitter contact region 63. In the section for the npn transistor, a p$^+$-type external base region is formed. Subsequently, in the section for the npn transistor, a second polycrystalline silicon film is formed, the second polycrystalline silicon film is doped with a p-type impurity, such as boron, by ion implantation, the doped second polycrystalline silicon film is subjected to a heat treatment to form a p-type base region, and the second polycrystalline silicon film is doped with an n-type impurity, such as arsenic, by ion implantation to form an n-type emitter region. A portion of the n$^+$-type second polycrystalline silicon film forms an emitter contact electrode. Then, contact holes are formed in the insulating film consisting of the SiO$_2$ film 10 and the thin SiO$_2$ film 7, and then a collector electrode 34, base electrode 35 and an emitter electrode 36 are formed of an Al-Si alloy through a Ti/TiN film 114 in the contact holes to complete the lateral pnp bipolar transistor 93 and the npn bipolar transistor 24, not shown.

Thus, the stable, high-performance lateral pnp transistor 93 having a reduced base width W$_B$ and the very-high-speed npn bipolar transistor 24 can be simultaneously fabricated.

A method of fabricating a lateral pnp bipolar transistor having a reduced base width W$_B$ as small a minimum line width which can be achieved by lithography, in a preferred embodiment according to the present invention will be described hereinafter with reference to FIGS. 10A to 10E.

Whereas development of high-speed npn bipolar transistors for ECL circuits have made remarkable progress in recent years and devices having a cut-off frequency f$_T$ of 30 GHz have been proposed, only a few pnp bipolar transistors have been proposed. It is particularly difficult to obtain a lateral pnp transistor having a cut-off frequency f$_T$ of 1 GHz. A lateral pnp transistor having a f$_T$ of 1 GHz or higher may be expected to be applied effectively to a low-power-consuming high-speed active pull-down circuit and to facilitate constructing a large-scale ECL circuit. A large-scale ECL gate array employs, in most cases, a Schottky TTL circuit provided with a Schottky barrier diode with a guard ring as an interface for MOS transistors. The guard ring enhances the withstand backward voltage of the Schottky barrier diode. Usually, the guard ring is formed through the ion implantation of boron (B$^+$) in a concentration on the order of $10^{18}$/cm$^3$ by using a resist mask. The method in this embodiment is intended to provide a high-performance lateral pnp bipolar transistor having a base width W$_B$ corresponding to a minimum line width which can be achieved by lithography by utilizing a guard ring forming process.

FIGS. 10A to 10E show only a lateral pnp bipolar transistor included in a large-scale integrated circuit (ECL circuit) having lateral pnp bipolar transistors, vertical npn bipolar transistors and Schottky barrier diodes with a guard ring.

Figure 10A:
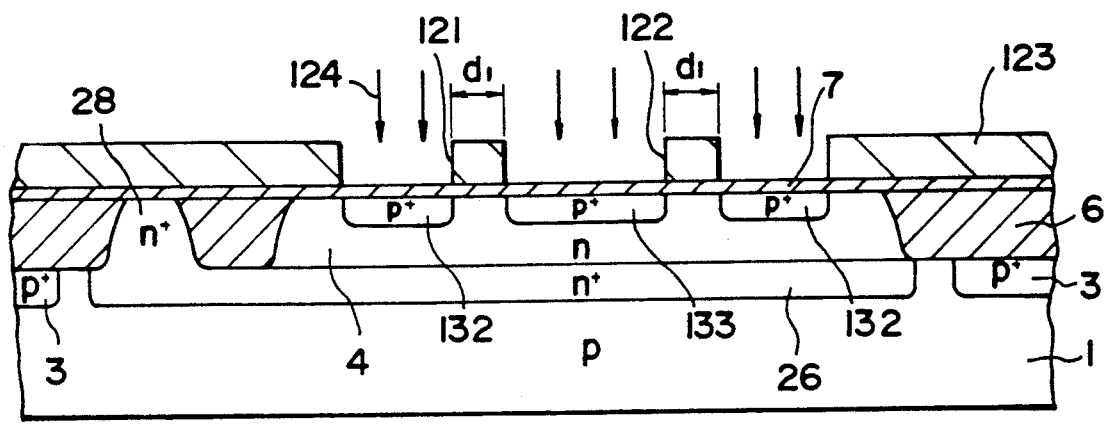
FIGS. 10A to 10E are sectional views of assistance in explaining steps of a method of fabricating a lateral bipolar transistor, in a further embodiment according to the present invention.

As shown in FIG. 10A, an embedded n-type base region 26 and p-type channel stop regions 3 are formed on a p-type silicon substrate 1, an n-type epitaxial layer 4 is formed, a field insulating layer 6 is formed by selective oxidation, and then n-type base contact region 28 is formed. After forming a thin SiO$_2$ film 7 by a CVD process, the epitaxial layer 4 is doped with a p-type impurity 124, such as boron, in a dose on the order of $10^{14}$/cm$^2$ by ion implantation by using a first resist mask 123 having openings 121 for collectors and an opening 122 for an emitter to form p-type collector regions 132 and a p-type emitter region 133. The interval d$_1$ between the openings 121 and 122 corresponds to a minimum line width which can be achieved by lithography. The resist mask 123 is used also for forming the guard ring of the Schottky barrier diode, not shown, and the guard ring is formed by the same ion implantation of boron for forming the p-type collector regions 132 and the p-type emitter region 133.

Figure 10B:
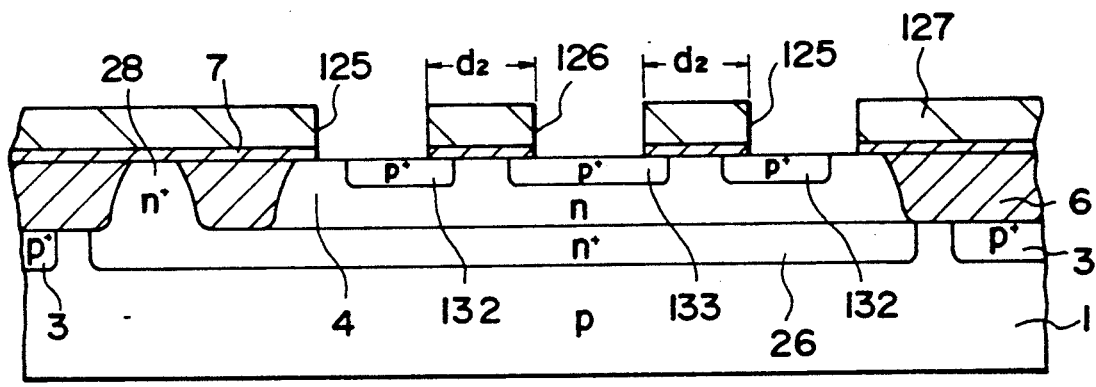

Then, as shown in FIG. 10B, the thin SiO$_2$ film 7 is etched selectively by using a second resist mask 127 having openings 125 and 126 corresponding respectively to the collector regions 132 and the emitter region 133. The interval d$_2$ between the openings 125 and 126 is greater than the interval d$_1$ between the openings 121 and 122 of the first resist mask 123.

Figure 10C:
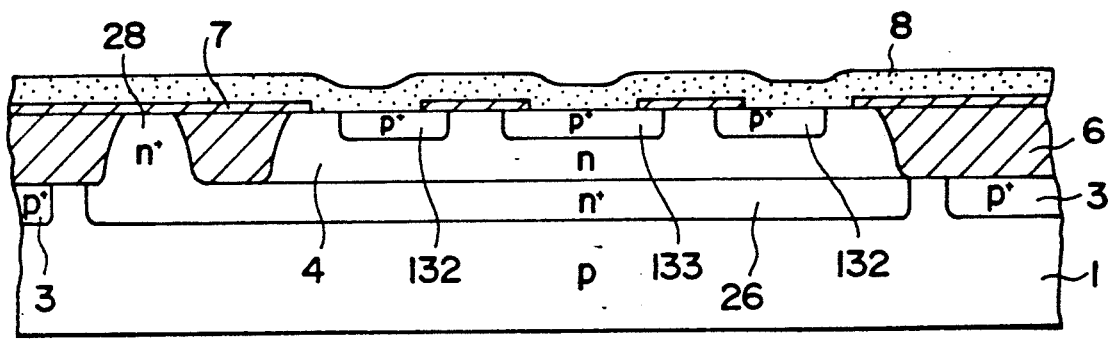

Then, as shown in FIG. 10C, a polycrystalline silicon film 8 is formed over the entire surface by a CVD process, and then the polycrystalline silicon film 8 is doped with a p-type impurity, such as boron, by ion implantation in a dose on the order of $10^{15}$/cm$^2$.

Figure 10D:
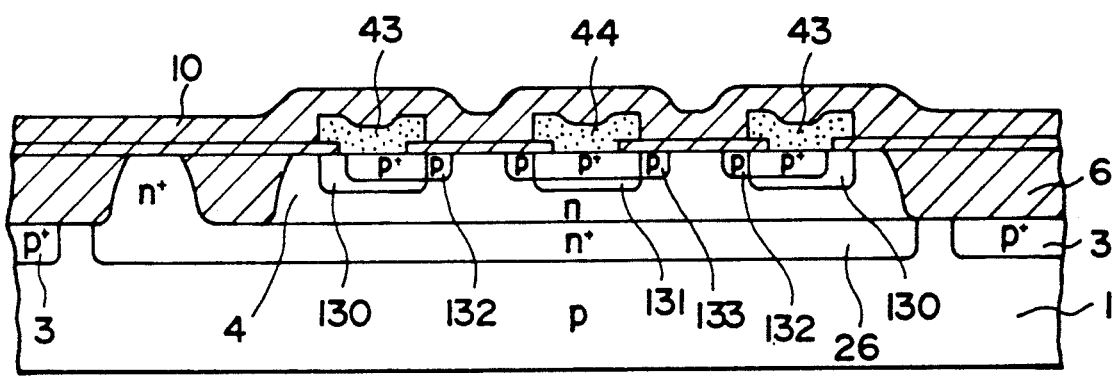
Figure 10E:
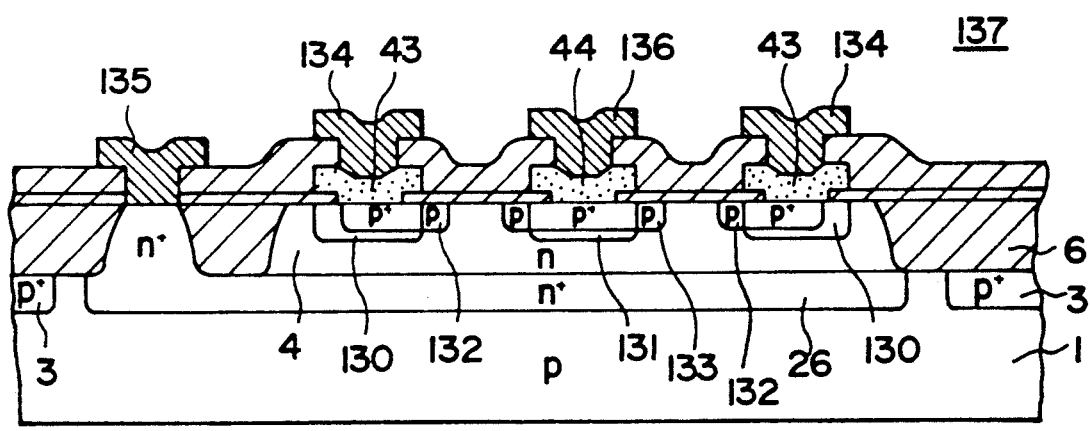

Then, as shown in FIG. 10D, the p$^+$-type polycrystalline silicon film 8 is patterned so that portions thereof corresponding to the openings 125 and 126 remain not removed to form collector contact electrodes 43 and an emitter contact electrode 44, a SiO$_2$ film 10 is formed over the entire surface by a CVD process, and then the work is subjected to a heat treatment to cause boron to diffuse from the p$^+$-type polycrystalline film to form p-type collector contact regions 130 and an emitter contact region 131. In the step of forming the collector contact electrodes 43 and the emitter contact electrode 44 with the p$^+$-type polycrystalline silicon film and the step of boron diffusion to form the collector contact regions 130 and the emitter contact region 131, the base contact electrode and p-type external base region of the very-high-speed npn bipolar transistor, not shown, are formed.

Subsequently, contact holes are formed, and then collector electrodes 134, a base electrode 135 and an emitter electrode 136 are formed in the contact holes. The electrodes of the Schottky barrier diode and the npn bipolar transistor are formed simultaneously with these electrodes 134, 135 and 136. The electrodes may be of a three-layer laminated structure consisting of a platinum silicide layer, a barrier metal layer and an aluminum layer. Thus, the lateral pnp bipolar transistor 137 is completed.

In this method, the p-type collector regions 132 and the p-type emitter region 133 are formed by ion implantation by using the first resist mask 123 having the interval d$_1$ corresponding to the minimum line width which can be achieved by lithography. Accordingly, the base width W$_B$ corresponds to the minimum line width and hence the lateral pnp bipolar transistor 137 has a high cut-off frequency f$_T$. Incidentally, f$_T$ = 1 GHz when the base width $W_B \fallingdotseq 1$ μm. Since the $SiO_2$ film is etched selectively by using the second resist mask 127 having the interval $d_2$ greater than the interval $d_1$ of the first resist mask 123 to form the openings 125 and 126, boron is caused to diffuse from the p+-type polycrystalline silicon film through the openings 125 and 126 to form the collector contact regions 130 and the emitter contact region 131, and the collector electrodes 134 and the emitter electrode 136 are formed in ohmic contact respectively with the collector contact regions 130 and the emitter contact region 131, the electrodes 134 and 136 can be readily formed by lithographic patterning.

Since the impurity concentration of the emitter contact region 131 is on the order of $10^{19}/cm^3$ and the emitter injection efficency is dependent on this high impurity concentration, a high current amplification factor $h_{FE}$ can be achieved even if the impurity concentration of a portion of the base region defining the base width $W_B$ is on the order of $10^{18}/cm^3$.

If the small base width $W_B$ reduces the early voltage $V_A$ to reduce the collector-emitter withstand voltage $V_{ceo}$, the intrinsic base region of the lateral pnp transistor may be doped with an n-type impurity, such as phosphorous, by ion implantation after the step shown in FIG. 10A. In such a case, the collector-emitter withstand voltage $V_{ceo}$ and the early voltage $V_A$ can be enhanced by adding only two steps for forming an opening for the base region and for doping the base region by ion implantation.

A method of fabricating a high-performance bipolar LSI comprising npn bipolar transistors, lateral pnp bipolar transistors and Schottky diodes, in a preferred embodiment according to the present invention will be described hereinafter with reference to FIGS. 11A to 11G.

As shown in FIG. 11A, p-type channel stop regions 3, an embedded n-type collector region 2, an embedded n-type base region 26 and an embedded n-type region 54 are formed in a npn bipolar transistor forming section 151, a lateral pnp bipolar transistor forming section 152 and a Schottky diode forming section 153 on a p-type silicon substrate 1, an n-type epitaxial layer 4 is formed over the surface of the work, and then the n-type epitaxial layer 4 is subjected to selective oxidation to form a field insulating layer 6 to demarcate the npn bipolar transistor forming section 151, the lateral pnp bipolar transistor forming section 152 and the Schottky diode forming section 153. Then, an n-type collector contact region 5 is formed in the npn bipolar transistor forming section 151 and and n-type base contact region 27 is formed in the lateral pnp bipolar transistor forming section 152. Then, a thin $SiO_2$ film 7 is formed over the entire surface of the work. A first resist mask 158 is formed over the thin $SiO_2$ film 7. The first resist mask 158 is provided with openings 154, 155, 156 and 157 corresponding respectively to a guardring region in the Schottky diode forming section 153, a collector region and an emitter region in the lateral pnp bipolar transistor forming section 152, and a link base region (a region including an external base region, a link base region and an active region) in the npn bipolar transistor forming section 151. Then, a p-type impurity, such as boron, is introduced through the openings 154, 155, 156 and 157 into the near-surface regions by ion implantation by energy in the range of 10 to 30 keV in a dose in the range of 1 to $4 \times 10^{13}/cm^2$ to form doped regions 158, 159, 160 and 161 of an impurity concentration on the order of $10^{18}/cm^2$.

Then, as shown in FIG. 11B, portions of the thin $SiO_2$ film 7 corresponding to the collector contact regions and emitter contact region of the lateral pnp bipolar transistor forming section 152, and the region including the external base region and active region of the npn bipolar transistor forming section 151 are removed selectively by using a second resist mask 62 to form openings 163 164 and 165.

Then, as shown in FIG. 11C, a first polycrystalline silicon film 8 of a thickness in the range of 1000 to 4000 Å is formed over the entire surface of the work including the openings 163, 164 and 165 by a CVD process.

Then, the polycrystalline silicon film 8 is doped with a p-type impurity, such as boron, by ion implantation in a dose on the order of $10^{15}/cm^2$ (an impurity concentration on the order of $10^{19}/cm^3$).

Figure 11D:
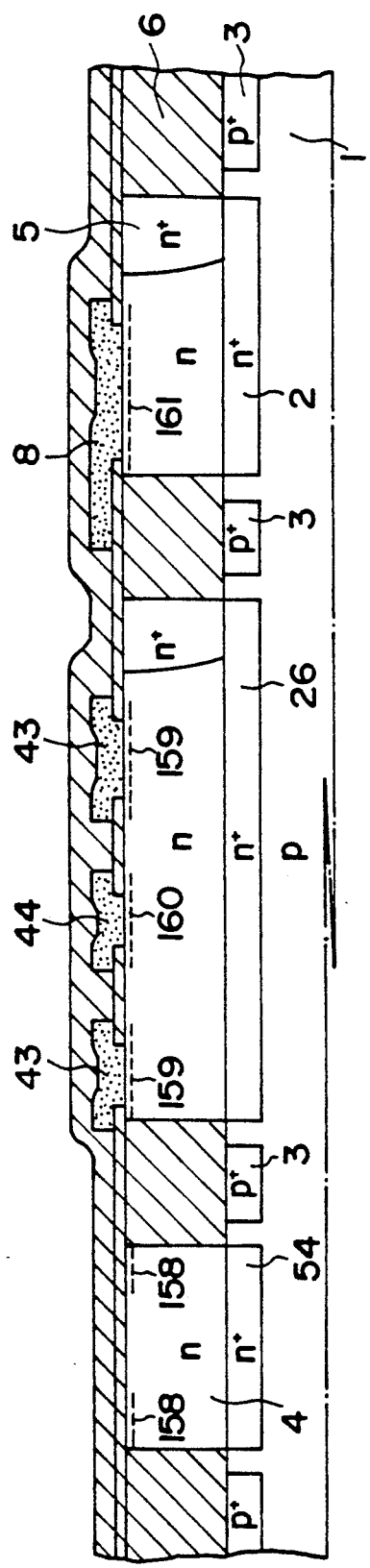

Subsequently, the p+-type polycrystalline silicon film 8 is patterned by using a resist mask, not shown, to form collector contact electrodes 43 and an emitter contact electrode 44 by the p+-type polycrystalline silicon film 8 in the lateral pnp bipolar transistor forming section 152, and a region having the external shape of a base electrode by the p+-type polycrystalline silicon film 8 in the npn bipolar transistor forming section 151 as shown in FIG. 11D. Then, a $SiO_2$ film 10 is formed over the entire surface of the work by a CVD process.

Subsequently, an opening, not shown, is formed by patterning the $SiO_2$ film 10 and the p+-type polycrystalline silicon film 8 by using a resist mask, not shown, to expose the active region for the intrinsic base region and emitter region of the npn bipolar transistor forming section 151 and to form a base contact electrode 12 (FIG. 11E) of p+-type polycrystalline silicon.

Figure 11E:
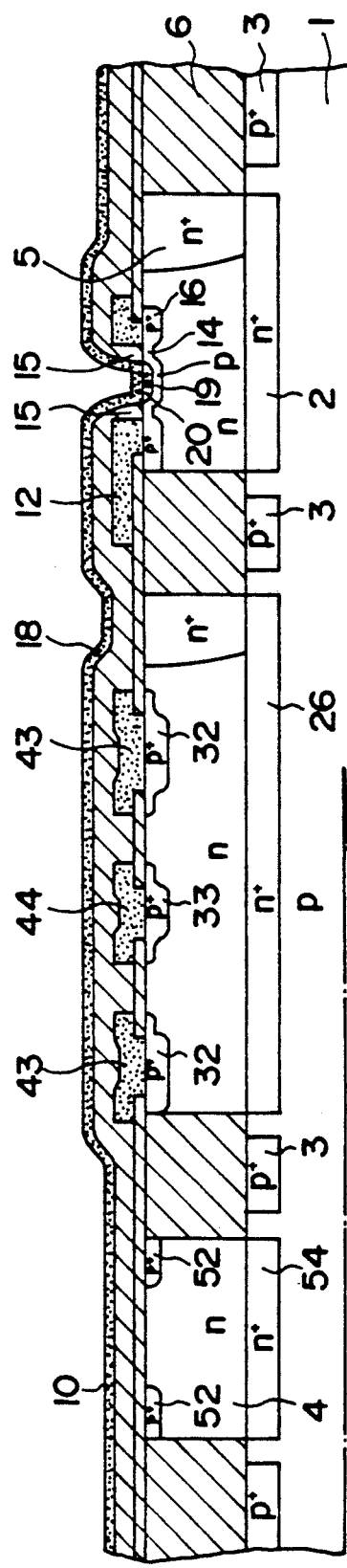

Then, as shown in FIG. 11E, a $SiO_2$ film is formed over the entire surface of the work including the opening by a CVD proces, and then the $SiO_2$ film is etched by a RIE process to form a side wall 15 over the side surface of the base contact electrode 12 formed in the opening. Then, a second polycrystalline silicon film 18 is formed over the entire surface of the work by a CVD process, a p-type impurity, such as boron, is introduced into the second polycrystalline silicon film 18 by ion implantation in a dose in the rage of $1 \times 10^{14}$ to $1 \times 10^{15}/cm^2$, and then the doped second polycrystalline silicon film 18 is annealed to form an intrinsic base region 19 in the npn bipolar transistor forming section 151. Subsequently, an n-type impurity, such as arsenic, is introduced into the second polycrystalline silicon film 18 by ion implantation in a dose on the order of $10^{16}/cm^2$, and then the doped second polycrystalline silicon film 18 is annealed to from an emitter region 20. The annealing process causes boron of the contact electrodes 43, 44 and 12 of the p+-type polycrystalline silicon film to diffuse and promotes the annealing of the boron ion-implanted in the step shown in FIG. 11A, so that two p+-type regions differing from each other in depth are formed, an external base region 16 and a link base region 14 are formed in the npn bipolar transistor forming section 151, collector regions 32 and an emitter region 33 are formed in the lateral pnp bipolar transistor forming section 152, and a p-type guardring region 52 is formed in the Schottky diode forming section 153. The p+-type region of a smaller depth is formed by the boron ions ion-implanted in the step shown in FIG. 11A, and the p+-type region of a greater depth is formed by the ion implantation of boron ion into the first polycrystalline silicon film 8.

Figure 11F:
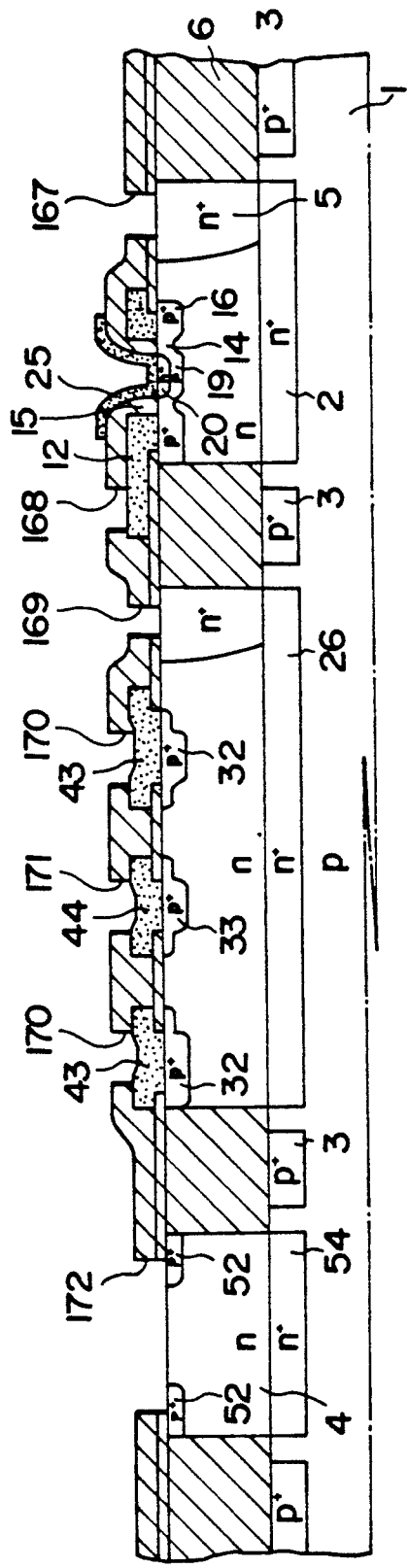

Then, as shown in FIG. 11F, the n+-type polycrystalline silicon film 18 is patterned by using a resist mask, not shown, to form an emitter contact electrode 25, and then the SiO2 film 10 is patterned to form contact holes 167 and 168 for the collector and base of the npn bipolar transistor forming section 151, contact holes 169, 170 and 171 for the collectors, base and emitter of the lateral pnp bipolar transistor forming section 152, and a contact hole 172 in the Schottky diode forming section 153.

Figure 11G:
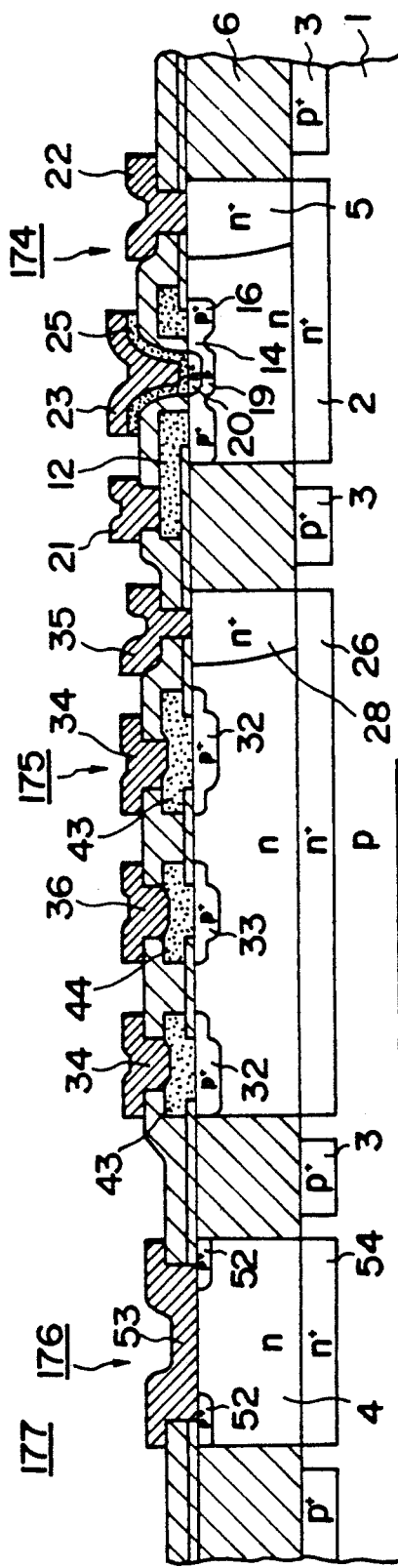

Then, as shown in FIG. 11G, a platinum film is formed over the entire surface of the work by vapor deposition, the platinum film is silicified, the platinum is removed with aqua regia or the like, films of barrier metal and aluminum are formed, and then the films of barrier metal and aluminum are patterned to form a collector electrode 22, a base electrode 21 and an emitter electrode 23 in the npn bipolar transistor forming section 151, collector electrodes 34, a base electrode 35 and an emitter electrode 36 in the lateral pnp bipolar transistor forming section 152, and a Schottky electrode 53 in the Schottky diode forming section 153. The platinum silicide film is in Schottky contact in the lightly doped regions and is in ohmic contact in the heavily doped regions. The electrodes may be formed of molybdenum silicide instead of platinum silicide. Thus, a high-performance bipolar LSI 177 comprising a vertical npn bipolar transistor 174, the lateral pnp bipolar transistor 175 and a Schottky barrier diode 176 with a guard ring is completed.

In this high-performance bipolar LSI 177, the base width $W_B$ of the lateral pnp transistor 175 determining the cut-off frequency $f_T$ is determined by the boron-doped p+-type region of a smaller depth, and the emitter injection efficiency is determined by the heavily doped p+-type region of a greater depth formed by boron diffusion from the p+-type polycrystalline silicon film shown in FIG. 11E. Thus, the lateral pnp transistor 175 has a high $f_T$ and a high $h_{FE}$. The lightly doped p+-type region of a smaller depth forming the emitter region 33 secures a high emitter-base withstand voltage.

In the vertical npn bipolar transistor 174, the intrinsic base region 19 and the external base region 16 are connected surely by the link base region 14 formed by boron ion implantation, and the intrinsic base region 19 is formed by boron diffusion from the second polycrystalline silicon film shown in FIG. 11E.

In the Schottky barrier diode 176 with a guardring, the guardring region 52 is formed by boron ion implantation in the step shown in FIG. 11A. The Schottky barrier diode 176 has a stable withstand voltage.

Thus, the p+-type region of a smaller depth forming the emitter region 33 and the collector regions 32 determining the base width $W_B$ of the lateral pnp bipolar transistor 175, the link base region 14 of the vertical npn transistor 174 and the guardring region 52 of the Schottky barrier diode 176 are formed simultaneously by ion implantation in the step shown in FIG. 11A. The highly doped collector regions 32 and highly doped emitter region 33 of the lateral pnp bipolar transistor 175, and the external base region 16 of the vertical npn bipolar transistor 174 are formed simultaneously to curtail the steps of the fabricating process. Thus, the high-performance bipolar LSI can be fabricated through a reduced number of steps without sacrificing the performance.

The very-high-speed bipolar transistor is provided with the link base region 14 directly below the side wall 15 to connect surely the intrinsic base region 19 formed by the diffusion of the impurity from the second polycrystalline silicon film, and the external base region 16 formed by the diffusion of the impurity from the first polycrystalline silicon film. It is difficult to form the link base region stably in a small depth by the conventional method previously described with reference to FIG. 21, in which the link base region is formed by ion implantation after forming openings in the active region for the intrinsic base region 19 and the emitter region 20.

A method of fabricating a very-high-speed bipolar transistor, capable of stably forming a link base region of a small depth will be described hereinafter with reference to FIGS. 12A to 12D. This method applies the diffusion of boron from p+-type polycrystalline silicon deposited on a thin SiO2 film through the thin SiO2 film into a silicon substrate (VLSI Shimpojumu Yoko-shu, pp. 17–18, 1989) to the formation of a link base region.

Figure 12A:
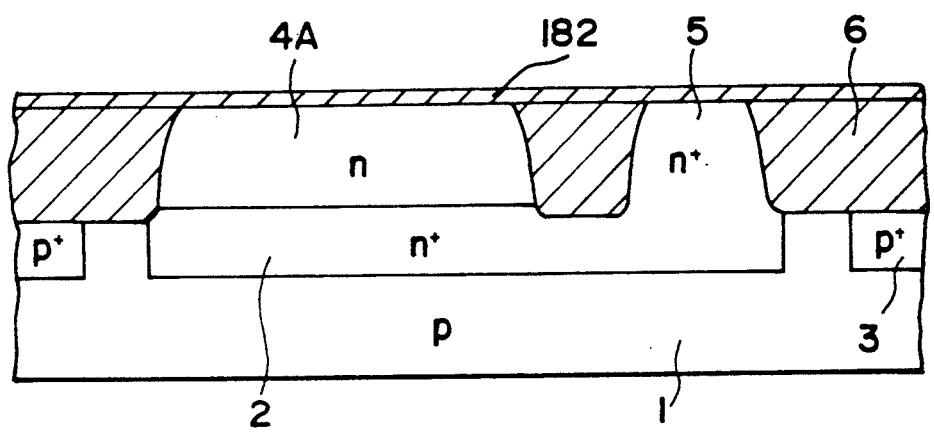
FIGS. 12A to 12D are sectional views of assistance in explaining steps of a method of fabricating a very-high-speed bipolar transistor, embodying the present invention.

As shown in FIG. 12A, an embedded collector region 2 of a second conduction type, for example, an n-type embedded collector region, a p-type channel stop region 3, an n-type region 4A formed by epitaxial growth and divided by a field insulating layer 6, and an n-type collector contact region 5 are formed on a silicon substrate 1 of a first conduction type, for example, a p-type silicon substrate, and then the surface of the work is coated with a thin SiO2 film 182.

Figure 12B:
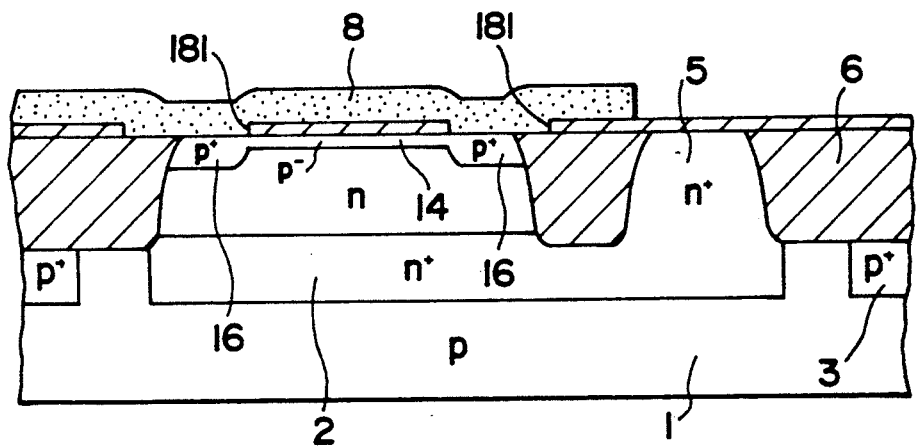

Then, as shown in FIG. 12B, the thin SiO2 film 182 is patterned to form openings 181 corresponding to external base regions to be formed afterward. Then, a first polycrystalline silicon film 8 is formed over the entire surface of the work by a CVD process. A p-type impurity, such as boron, is introduced into the first polycrystalline silicon film 8 by ion implantation, and then a portion of the thus doped p+-type polycrystalline silicon film 8 corresponding to the n-type collector contact region 5 is removed by patterning, in which the external base region may be patterned. Then, the work is annealed to form a p+-type external base region 16 through the diffusion of boron from the p+-type polycrystalline silicon film 8 through the opening 181 and to form a p−-type link base region 14 through the diffusion of boron from the p+-type polycrystalline film 8 through thin SiO2 film 182 into the n-type region 4A. Annealing in a hydrogen atmosphere promotes the penetration of boron through the thin SiO2 film 182.

Figure 12C:
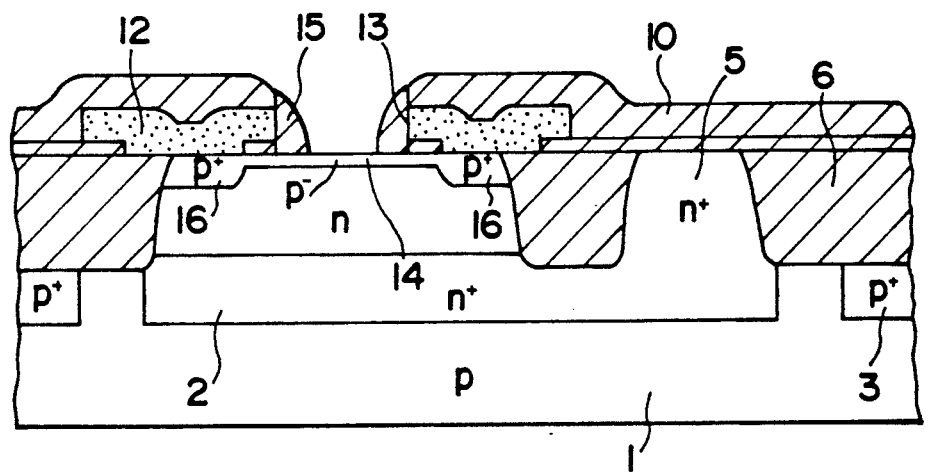

Then, as shown in FIG. 12C, the p+-type polycrystalline silicon film 8 is patterned in the shape of the external base electrode, and then a SiO2 film 10 is formed over the entire surface of the work by a CVD process. Then, portions of the SiO2 film 10, the p+-type polycrystalline silicon film 8 and the thin SiO2 film 182 corresponding to an active region are removed by selective etching to form an opening 13 and a base contact electrode 12 of the p+-type polycrystalline silicon film. Then, a SiO2 film is formed by a CVD process, the SiO2 film is densified and etched to form a side wall 15 of SiO2 over the inner surface of the opening 13.

Figure 12D:
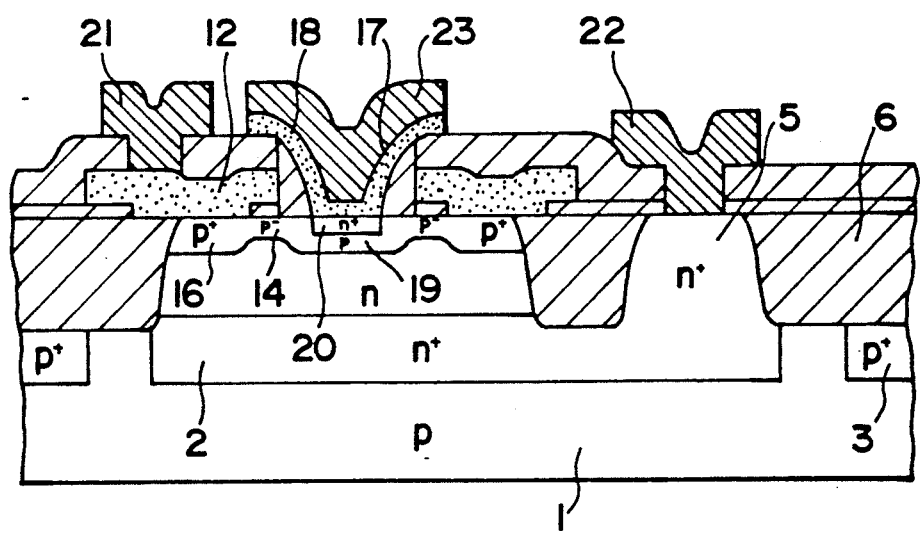

Then, as shown in FIG. 12D, a second polycrystalline silicon film 18 for forming an emitter contact electrode is deposited by a CVD process in an opening 17 defined by the side wall 15, the second polycrystalline silicon film 18 is doped with a p-type impurity, such as boron, by ion implantation and the doped second polycrystalline silicon film 18 is annealed to form a p-type intrinsic base region 19. Subsequently, the second polycrystalline silicon film 18 is doped with an n-type impurity, such as arsenic, by ion plantation, the doped second polycrystalline silicon film 18 is annealed to from an n-type emitter region 20. The second polycrystalline silicon film 18 forms an emitter contact electrode. It is also possible to form the p-type intrinsic base region 19 and then-type emitter region 20 simultaneously by annealing after doping the second polycrystalline silicon film 18 with the p-type and n-type impurities. Then, contact holes are formed and a metal is deposited in the contact holes to form a collector electrode 22, a base electrode 21 and an emitter electrode 23 to complete a very-high-speed bipolar transistor 183.

Thus, the method forms the link base region 14 through the diffusion of boron from the p$^+$-type polycrystalline silicon film 8 formed over the thin $SiO_2$ film 182 through the thin $SiO_2$ film 182. Therefore, channeling does not occur and hence the link base region 14 can be stably formed in a small depth. Thus the method is capable of fabricating a very-high-speed bipolar transistor of high reliability.

A method of fabricating a Schottky barrier diode will be described hereinafter.

A method of fabricating a conventional Schottky barrier diode employing a metal silicide, such as titanium silicide, employs a selective etching process or a non-selective etching process. As shown in FIGS. 14A to 14E, the method employing a selective etching process forms an opening 187 in a $SiO_2$ film 186 formed over the major surface of a silicon substrate 185, a titanium film 188 is deposited over the entire surface of the work (FIG. 14A), the titanium film 188 is annealed for silicification to form a $TiSi_2$ film 189 in the opening (FIG. 14B).

Figure 14A:
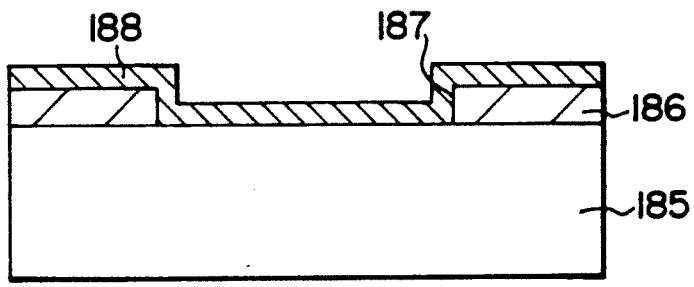
FIGS. 14A to 14E are sectional views of assistance in explaining steps of a conventional method of fabricating a Schottky barrier diode by selective etching.
Figure 14B:
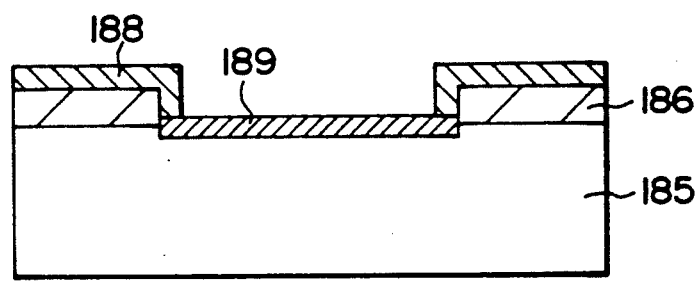
Figure 14C:
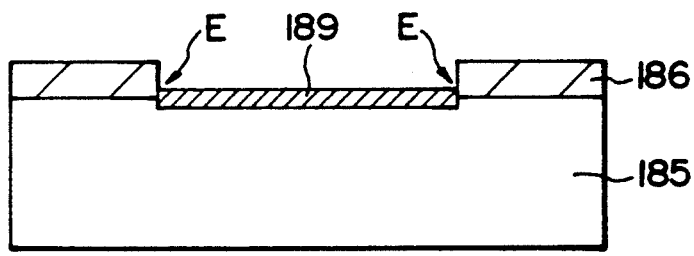
Figure 14D:
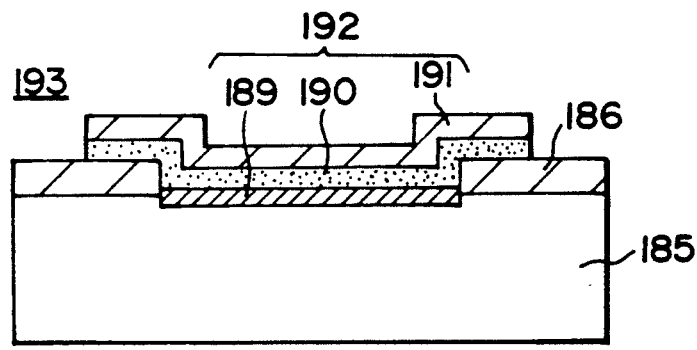

Then, the residual titanium film 188 is removed by selective etching (FIG. 14C), metal films, for example, TiN film 190 and an AlSi film 191, are formed, and then the metal films 190 and 191 are patterned to form an electrode 192 to complete a Schottky barrier diode 193 (FIG. 14D).

Figure 14E:
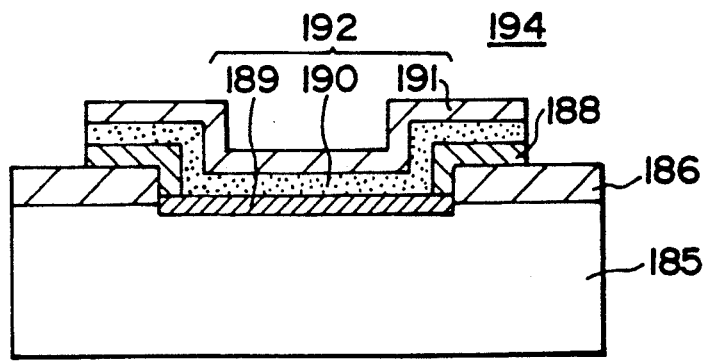

On the other hand, the method forms the TiN film 190 and an AlSi film 191 as shown in FIG. 14E after the step of FIG. 14B without etching the titanium film 188, and the TiN 190 and the AlSi film 191 are patterned to form the electrode 192 to complete the Schottky diode 194.

The method 1 including the steps shown in FIGS. 14A, 14B, 14C and 14D has disadvantage that the titanium film 188 is silicified to form a $TiSi_2$ having a high resistance because the titanium film 188 is liable to be oxidized by annealing in an atmosphere containing oxygen, edges E of the $TiSi_2$ film 189 after the selective etching of the titanium film 1898 in the step shown in FIG. 14C allows the penetration of a metal, such as aluminum, into the $TiSi_2$ film 189 to cause leakage current, the barrier of the TiN film 189 is not high enough to prevent leakage current due to the penetration of aluminum or the like therein, and the method 1 has many steps.

The method including the steps shown in FIGS. 14A, 14B and 14E also has a disadvantage that the barrier of the TiN film 190 is not high enough.

Figure 15A:
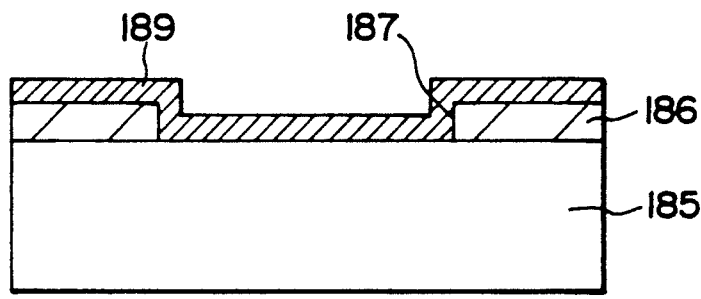
FIGS. 15A and 15B are sectional views of assistance in explaining steps of a conventional method of fabricating a Schottky barrier diode by non-selective etching.
Figure 15B:
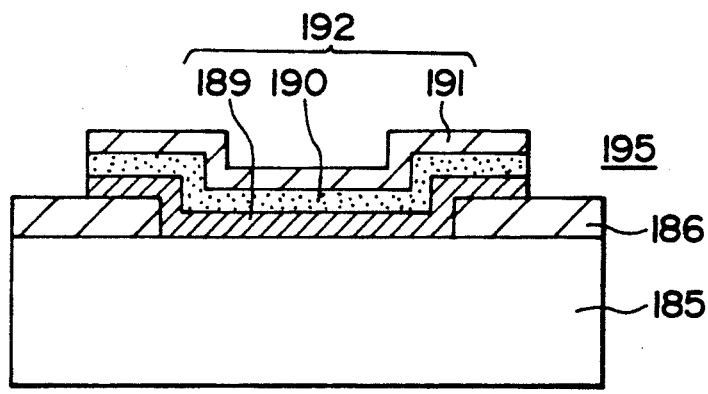
Figure 16:
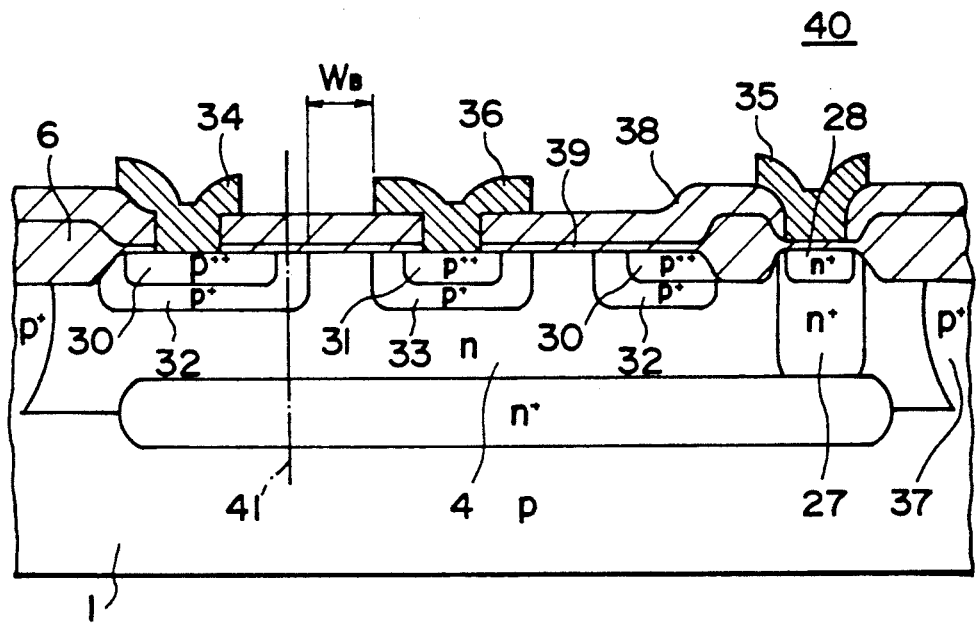
FIG. 16 is a sectional view of a conventional lateral bipolar transistor.
Figure 17:
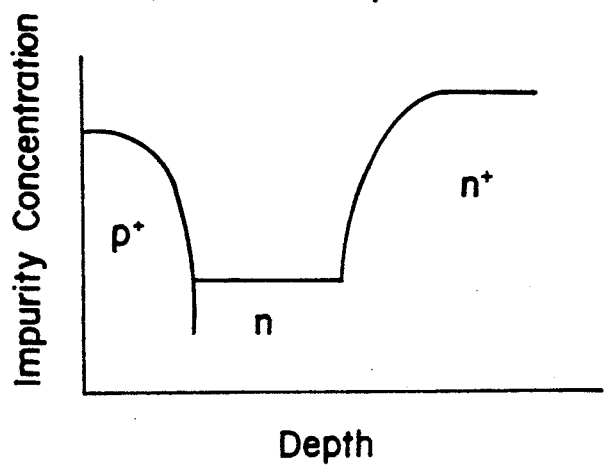
FIG. 17 is a graph showing an impurity concentration profile in the lateral bipolar transistor of FIG. 16.
Figure 18:
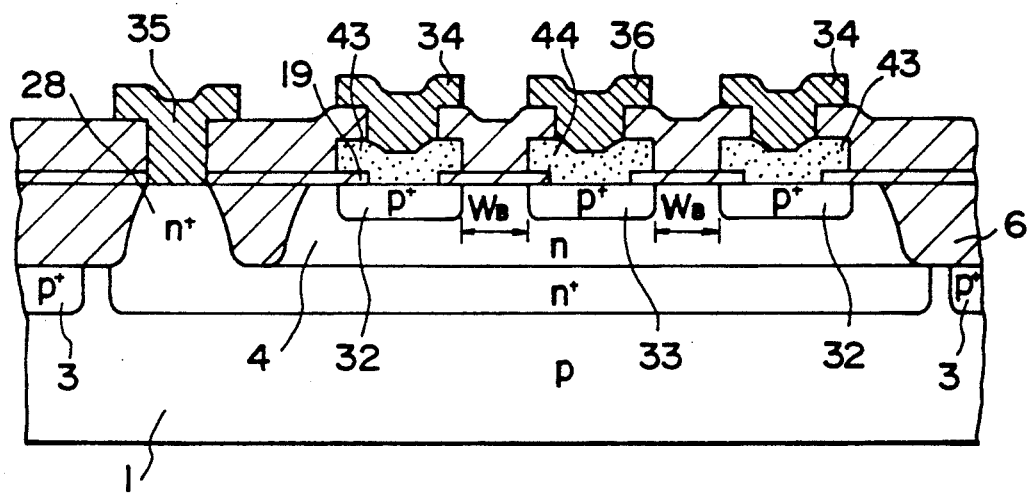
FIG. 18 is a sectional view of another conventional lateral bipolar transistor.
Figure 19:
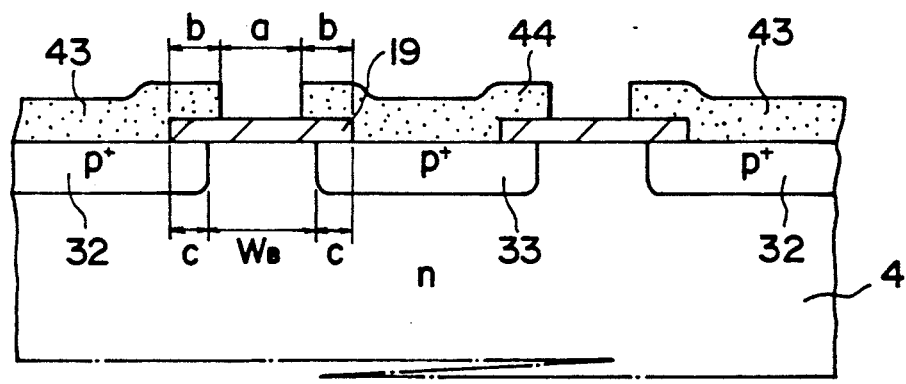
FIG. 19 is an enlarged sectional view of an essential portion of the lateral bipolar transistor of FIG. 18.
Figure 20:
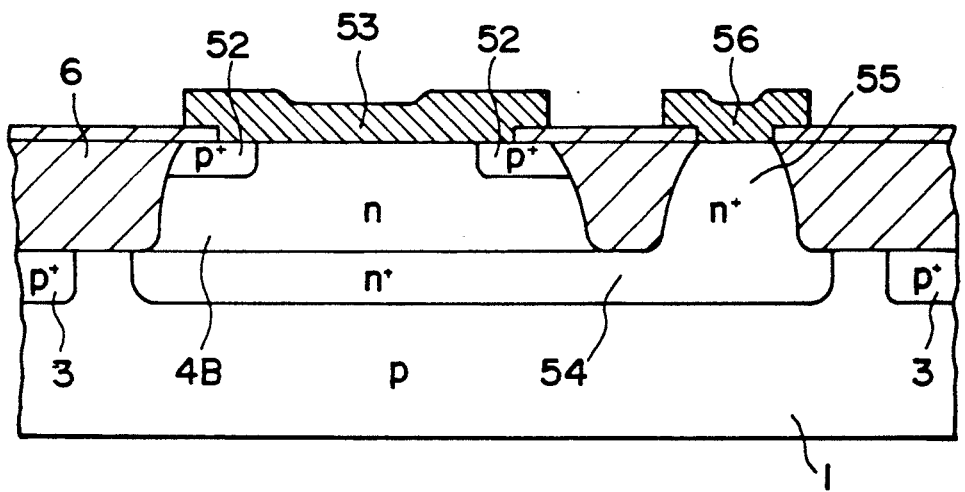
FIG. 20 is a sectional view of a conventional Schottky barrier diode with a guard ring.

As shown in FIGS. 15A and 15B, the non-selective etching process forms an opening 187 in a $SiO_2$ film formed on the major surface of the silicon substrate 185, and a $TiSi_2$ film 198 is deposited by sputtering or the line using a compound target over the entire surface of the work as shown in FIG. 15A, the TiN film 190 and the AlSi film 191 are formed over the $TiSi_2$ film, the TiN film 190 and the AlSi film 191 are patterned simultaneously by RIE to form the electrode 192 to complete the Schottky barrier diode 195 as shown in FIG. 15B. The quality of the $TiSi_2$ film thus formed by This method, however, is not satisfactory (no perfect $TiSi_2$ film is formed), a Schottky barrier height $\phi_B$ of titanium is produced and a Schottky barrier is difficult to be formed, and the barrier of the TiN film 190 is not satisfactorily high.

Figure 13A:
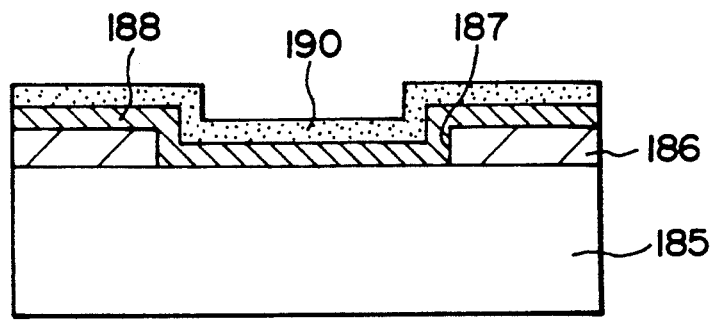
FIGS. 13A to 13C are sectional views of assistance in explaining steps of a method of fabricating a Schottky barrier diode, embodying the present invention.
Figure 13B:
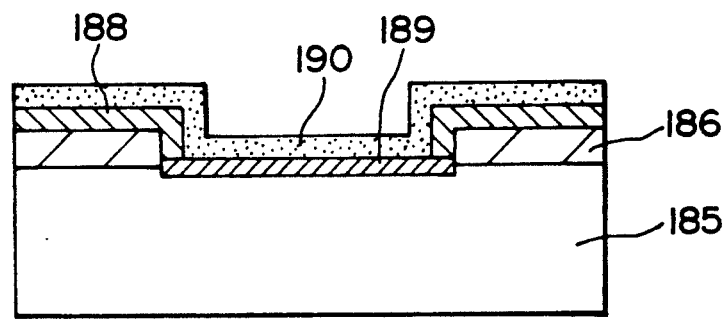
Figure 13C:
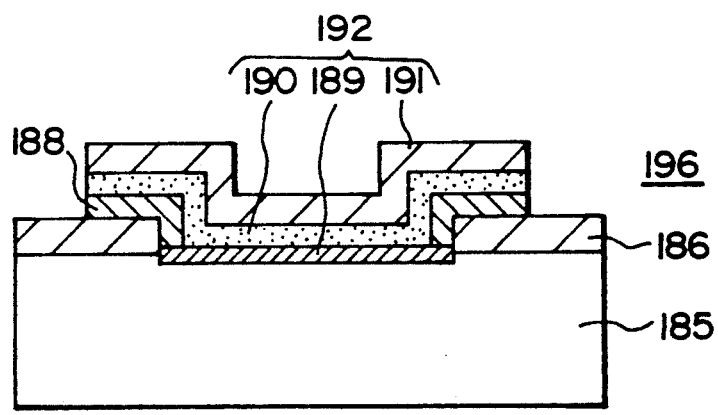

FIGS. 13A to 13C show an improved method of fabricating a Schottky barrier diode. Basically, a refractory metal and a barrier metal are deposited successively on a silicon substrate coated with an insulating film having an opening, the refractory metal is annealed for silicification, an aluminum alloy film if formed, the aluminum alloy film, the refractory metal and the barrier metal are patterned to form an electrode.

As shown in FIG. 13A, an opening 187 is formed on a $SiO_2$ film formed over the major surface of a silicon substrate 185, and then a Ti film and a TiN film are formed successively over the entire surface of the work.

Then, as shown in FIG. 13B, the work is subjected to annealing for silicification to form a $TiSi_2$ film 189 over the surface of the silicon substrate 185. Then, as shown in FIG. 13C, an aluminum alloy film, such as an AlSi film is formed by evaporation, and then the AlSi film, the TiN film 190 and the Ti film 188 are patterned by selective etching to form an electrode 192. Thus, a Schottky barrier diode is completed.

According to this method, the TiN film 190 formed over the Ti film 188 protects the Ti film 188 from oxidation, so that the $TiSi_2$ film 189 of a satisfactory quality having a low specific resistance is formed. Before annealing, the TiN film 190 is reinforced by $O_2$. Since the annealing is carried out in a nitrogen atmosphere, the potential of the TiN film 190, i.e., the barrier metal, is improved. Consequently, the $TiSi_2$ film 180 has a low specific resistance and uniform Schottky barrier height $\phi_B$, and the TiN film 190 has an excellent barrier characteristic. The method includes simple steps of fabrication, and the Schottky barrier diode thus fabricated has satisfactory characteristics.

A lateral bipolar transistor in accordance with the first aspect of the present invention comprises collector regions and an emitter region each having a portion having a maximum impurity concentration formed within the substrate instead of the surface of the substrate, so that the influence of surface recombination is suppressed, a high $h_{FE}$ is achieved, change in surface recombination current is reduced, the $h_{FE}$ is uniform and stable.

A method of fabricating a lateral bipolar transistor, in accordance with the second aspect of the present invention forms collector regions, and an emitter region in a lateral arrangement on a semiconductor substrate serving as a base region by using a first mask provided with a pair of openings, and then forms heavily doped regions connected respectively to the collector regions and the emitter regions by using a second mask provided with openings formed at an interval smaller than that between the openings of the first mask to form the base region in a base width as small as the minimum line width which can be achieved by lithography. Thus, a lateral bipolar transistor thus fabricated has a high $f_T$ and a high $h_{FE}$.

A method of fabricating a high-performance bipolar LSI, in accordance with the third aspect of the present invention forms a mask for simultaneously forming openings, forms simultaneously the emitter region and collector regions of a lateral transistor, the guardring region of a Schottky barrier diode, and the link base region (a region for connecting an external base region and an intrinsic base region) by doping regions corresponding to the openings. Thus, the method is capable of fabricating the high-performance bipolar LSI easily through a reduced number of steps without sacrificing the performance at a high yield rate.

Although the invention has been described in its preferred forms with a certain degree of particularity, obviously many changes and variations are possible therein. It is therefore to be understood that the present invention may be practiced otherwise than as specifically described herein without departing from the scope and spirit thereof.

What is claimed is:

1. A semiconductor device comprising a semiconductor substrate provided with a collector region, a base region, and an emitter region in a lateral arrangement, said base region being formed of material having a first conductivity, said emitter and collector regions being formed of a material having a second conductivity, said emitter and collector regions both being formed with regions having an increased level of impurity concentration relative to said base region, a further region of said second conductivity located adjacent said collector region, with a greater impurity concentration than is in said collector region, and a further region of said second conductivity located adjacent said emitter region, with an impurity concentration greater than that of said emitter region, in which the impurity concentration of said emitter and collector regions each decrease from a maximum in the direction toward the surface of said substrate, and also decrease from said maximum in the opposite direction.

* * * * *

UNITED STATES PATENT AND TRADEMARK OFFICE
CERTIFICATE OF CORRECTION

PATENT NO. : 5,163,178

DATED : Nov. 10, 1992

INVENTOR(S) : "SEMICONDUCTOR DEVICE HAVING ENHANCED IMPURITY..."

It is certified that error appears in the above-identified patent and that said Letters Patent is hereby corrected as shown below:

On the Title page, item [75]
Please correct the spelling of the fourth inventor listed to read: Norikazu --Ohuchi--, instead of "Chuchi".

Signed and Sealed this

Ninth Day of November, 1993

Attest:

BRUCE LEHMAN

*Attesting Officer*    *Commissioner of Patents and Trademarks*